United States Patent [19]

Takasugi

[11] Patent Number: 5,327,390
[45] Date of Patent: Jul. 5, 1994

[54] SYNCHRONOUS BURST-ACCESS MEMORY
[75] Inventor: Atsushi Takasugi, Tokyo, Japan
[73] Assignee: Oki Electric Industry Co., Ltd., Tokyo, Japan
[21] Appl. No.: 121,504
[22] Filed: Sep. 15, 1993

Related U.S. Application Data

[62] Division of Ser. No. 735,626, Jul. 24, 1991, Pat. No. 5,268,865.

[30] Foreign Application Priority Data

Jul. 25, 1990 [JP] Japan .................................. 2-196877
Sep. 28, 1990 [JP] Japan .................................. 2-259697

[51] Int. Cl.$^5$ .......................................... G11C 8/00
[52] U.S. Cl. ................................ 365/230; 365/230.08
[58] Field of Search .................... 365/230.06, 230.08, 365/189.05, 233, 230.01, 189.09

[56] References Cited

U.S. PATENT DOCUMENTS

| | | | |
|---|---|---|---|
| 4,513,372 | 4/1985 | Ziegler et al. | 364/200 |
| 4,608,678 | 8/1986 | Threewitt | 365/189.05 |
| 4,829,484 | 5/1989 | Arimoto et al. | 365/189.05 |
| 4,891,791 | 1/1990 | Iijima | 365/189.05 |
| 4,928,265 | 5/1990 | Higuchi et al. | 365/189.05 |
| 4,984,217 | 1/1991 | Sato | 365/230.02 |
| 4,985,868 | 1/1991 | Nakano | 365/230.08 |
| 5,003,510 | 3/1991 | Kamisaki | 365/189.05 |
| 5,016,226 | 5/1991 | Hiwada et al. | 365/189.05 |
| 5,111,386 | 5/1992 | Fujishima et al. | 365/189.05 |

FOREIGN PATENT DOCUMENTS 0135940  4/1985  European Pat. Off. .
225995   9/1988  Japan .
8933     1/1990  Japan .

OTHER PUBLICATIONS

Electronic Design, vol. 36, No. 19, Aug. 25, 1988, Hasbrouck Heights, N.J., pp. 93–96—Shakaib Iqbal "Internally Timed RAMs Build Fast Writable Control Stores", p. 95, line 15–p. 96, line 16, FIG. 4.

Primary Examiner—Eugene R. LaRoche
Assistant Examiner—A. Zarabian
Attorney, Agent, or Firm—Spencer, Frank & Schneider

[57] ABSTRACT

A synchronous burst-access memory latches a row address strobe signal, a column address strobe signal, and address signals in synchronization with a clock signal. Data are stored in rows and columns in a memory cell array. Data in a selected row are input and output in serial bursts in synchronization with the clock signal, starting from a selected column. The row and initial column address are provided as external inputs; subsequent column addresses are generated by an internal address counting circuit.

A word-line driving circuit for a synchronous memory uses transparent latches to latch the row address strobe signal and address signals, enabling row address decoding to be completed prior to synchronization with the clock signal.

3 Claims, 25 Drawing Sheets

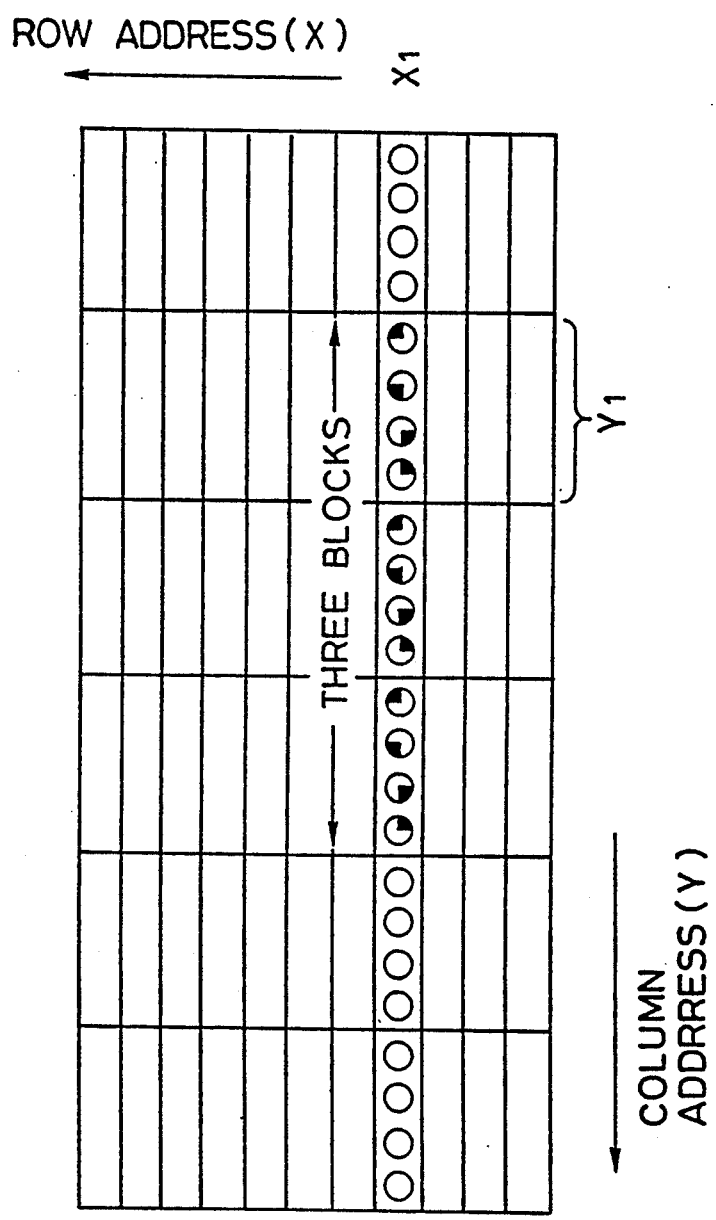

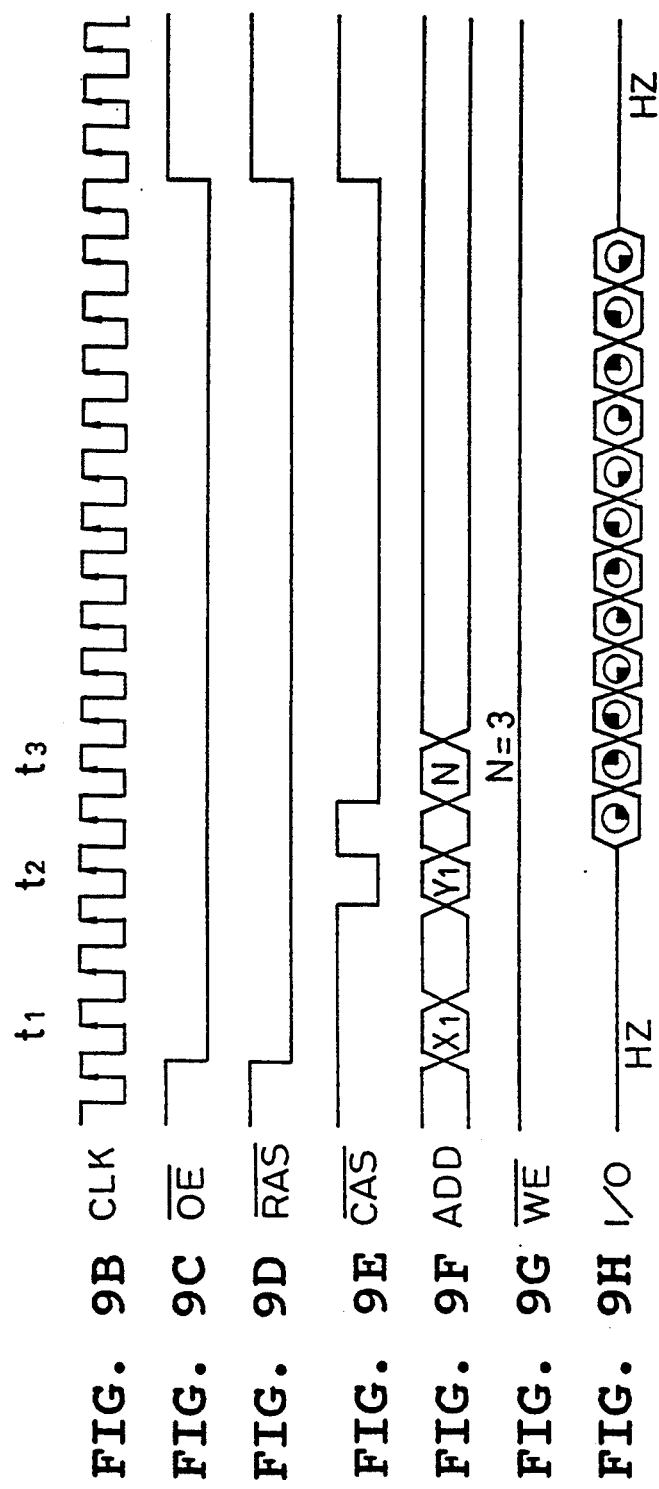

F I G. 11A
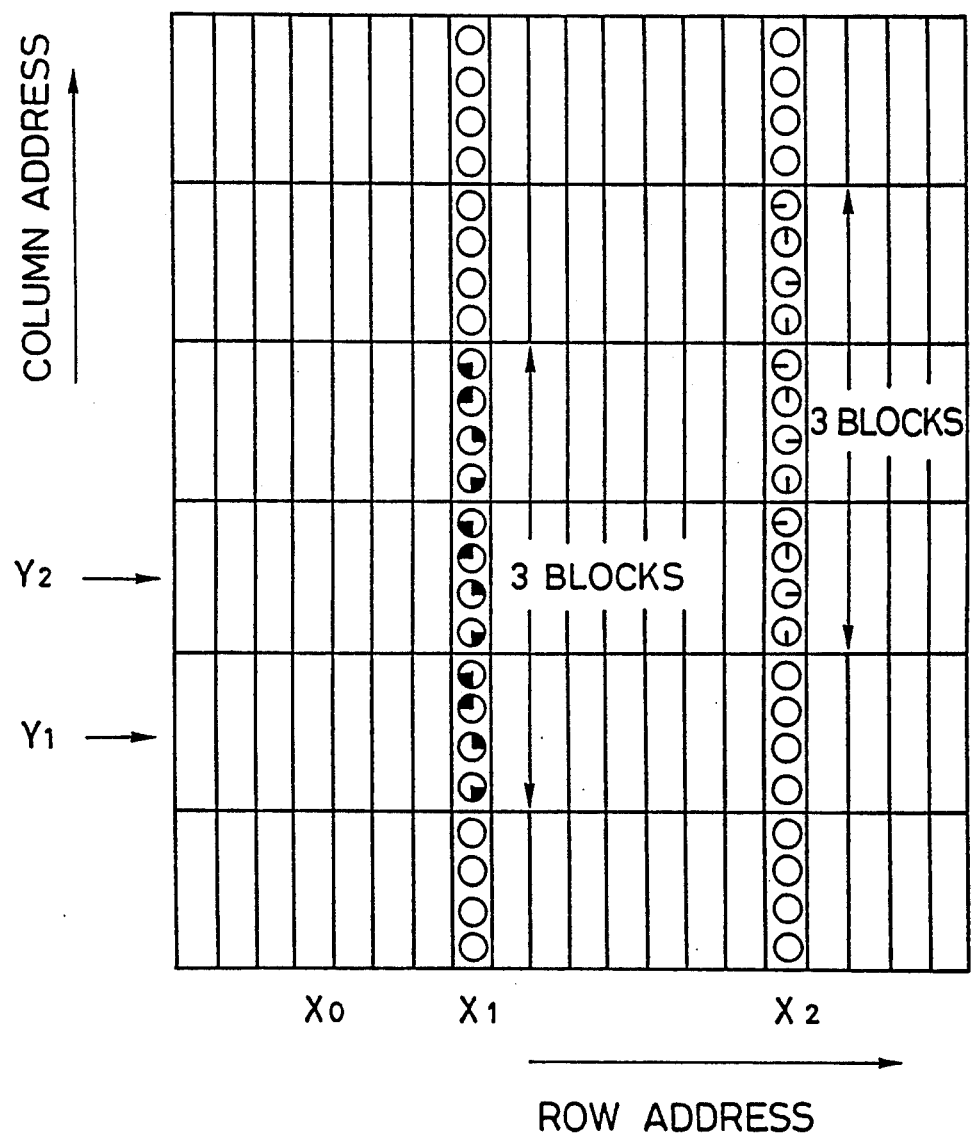

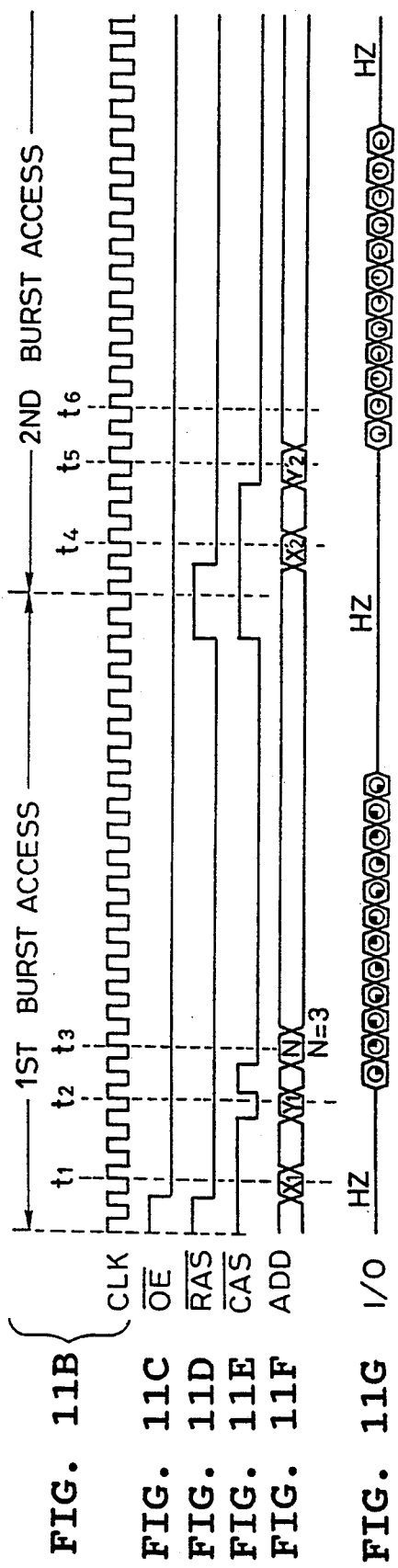

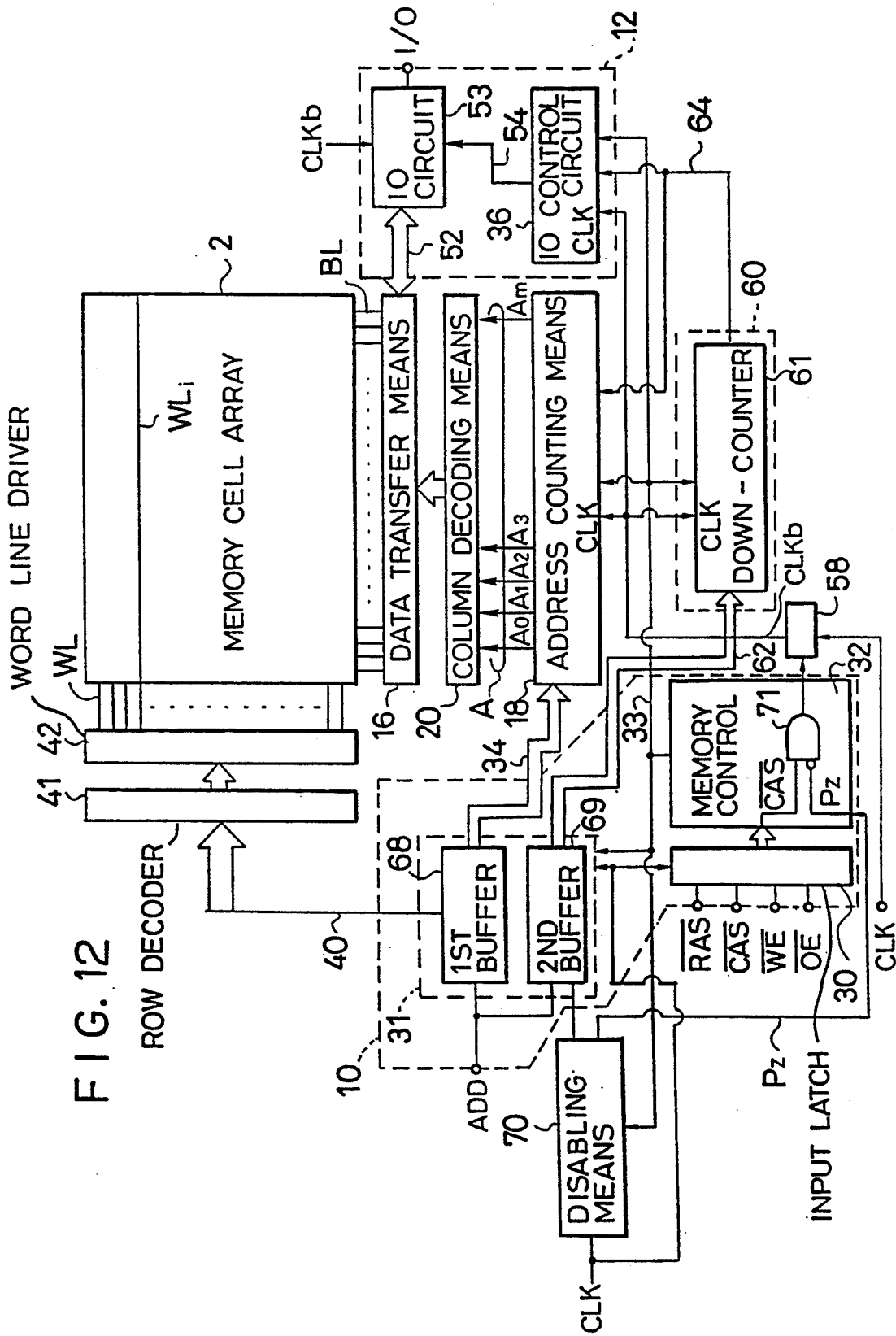

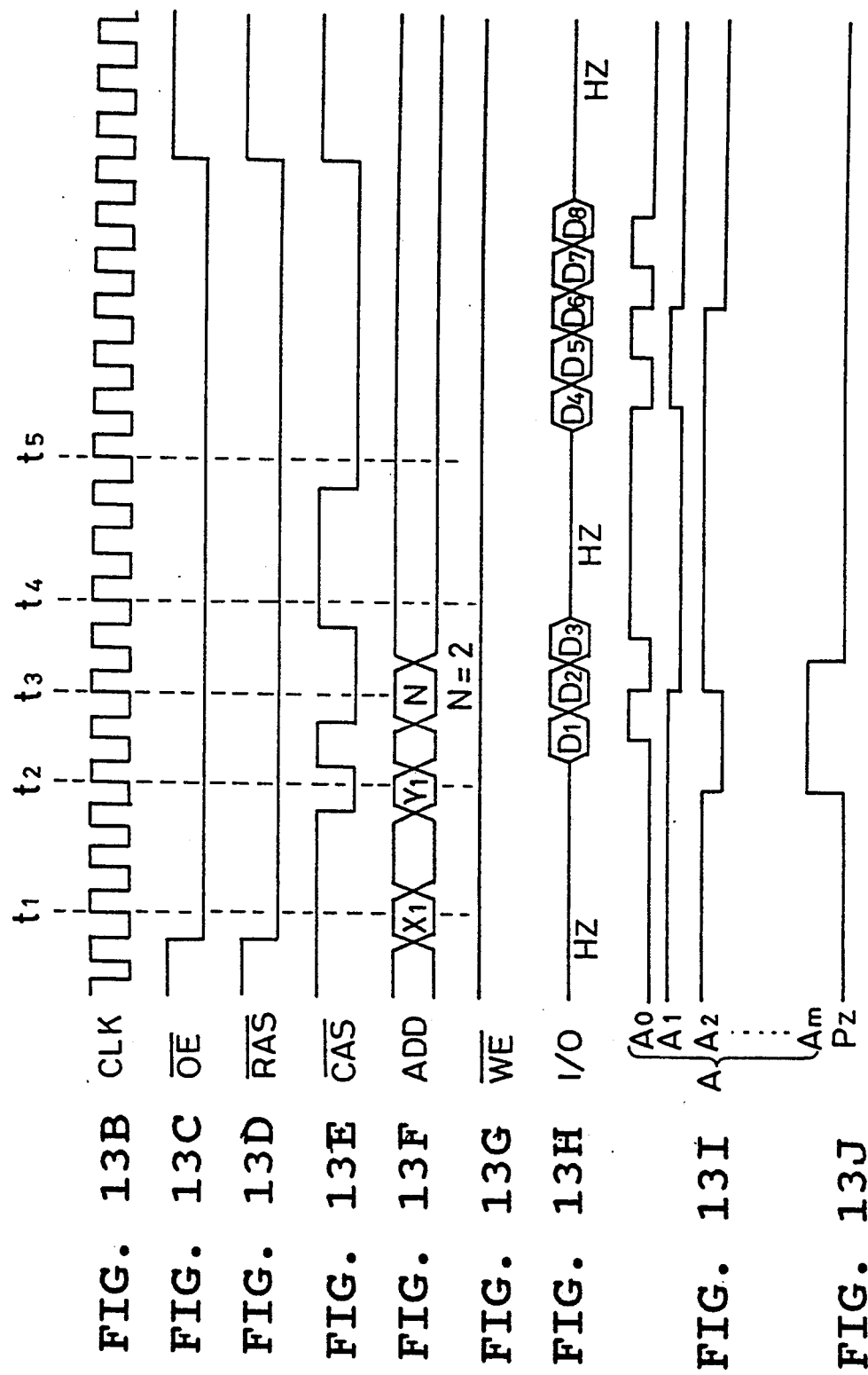

FIG. 18A  CLK 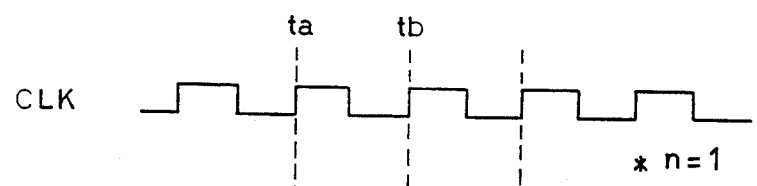

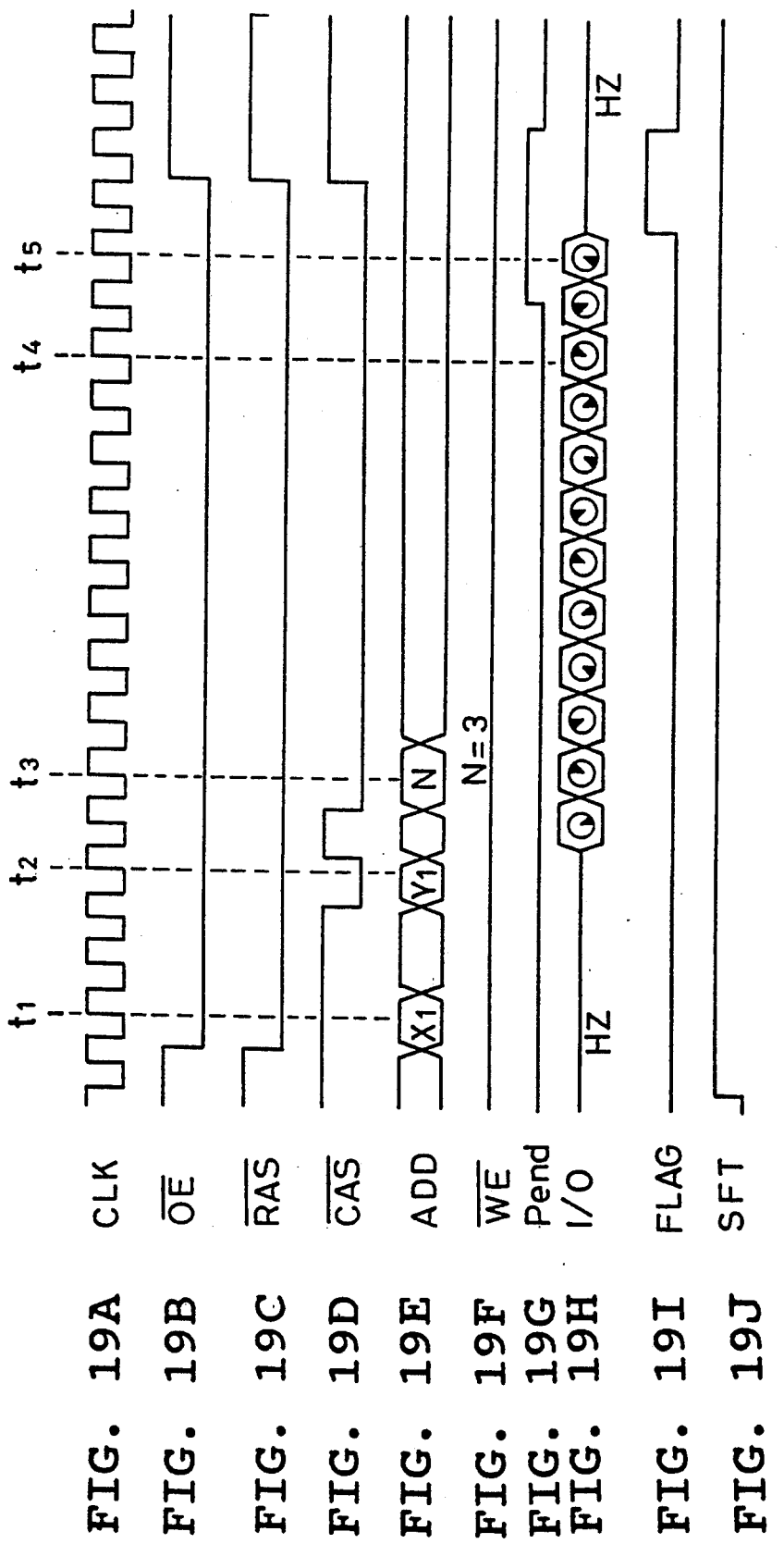

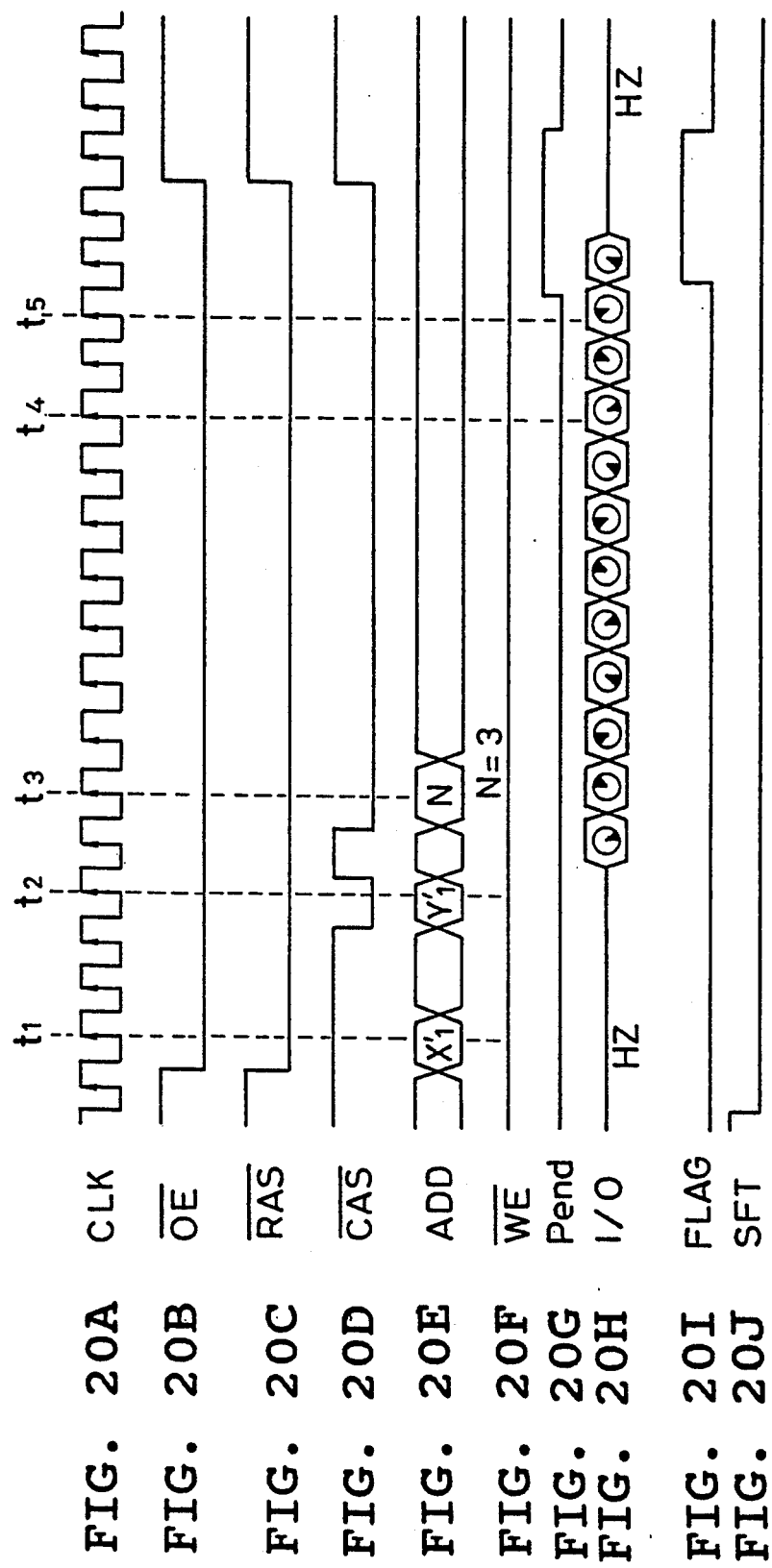

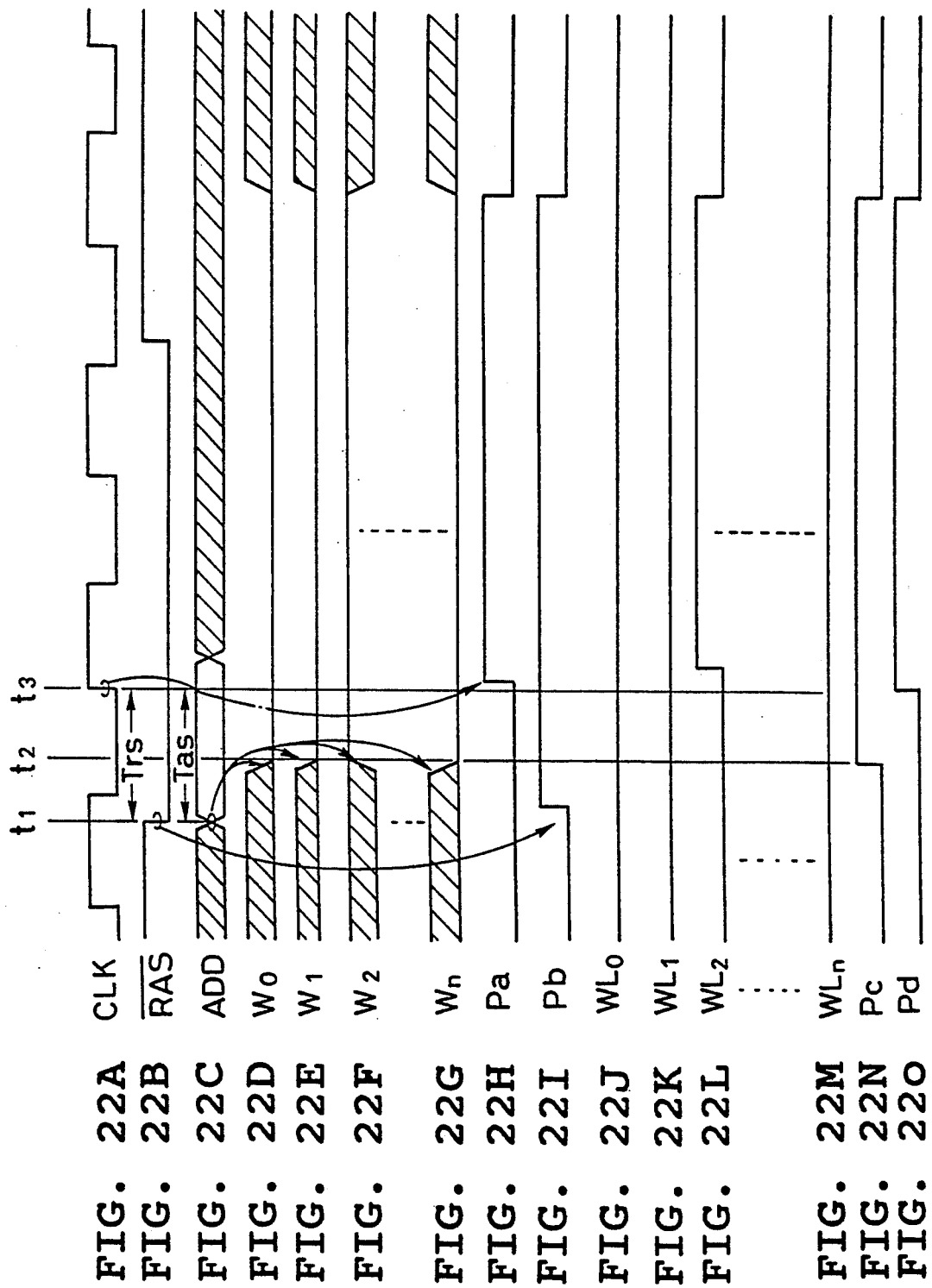

SYNCHRONOUS BURST-ACCESS MEMORY

This is a division of application Ser. No. 07/735,626, filed Jul. 24, 1991 now U.S. Pat. No. 5,268,865.

BACKGROUND OF THE INVENTION

This invention relates to a type of dynamic random-access memory (dynamic RAM, or DRAM) that is written and read in high-speed bursts synchronized with a clock signal. This novel type of memory will be referred to below as a synchronous burst-access memory.

A synchronous burst-access memory can be compared to the well-known dual-port random-access memory (dual-port RAM). A dual-port RAM basically comprises an array of DRAM memory cells and a data register. The memory cells can be accessed "at random" by latching a row address, then a column address, and reading or writing the bit or bits located at the intersection of the row and column. Alternatively, an entire row of bits can be transferred at once to the data register, then read serially in synchronization with a clock signal. Some dual-port RAMs enable data to be written serially as well as read. Serial and random access can be carried out simultaneously, and serial access can be performed at high speed.

Dual-port RAM has often been used to store image data which are read serially to generate a video signal for a raster-scan display. More recently, dual-port RAM has been used in systems employing processors of the reduced instruction-set type (so-called RISC processors), which run at high speeds and often require access to a series of bits.

A drawback of dual-port RAM is that complex on-chip circuitry is required to control two ports simultaneously. This leads to chip sizes 40% to 50% larger than general-purpose DRAM, and increases the cost of manufacturing and testing the chip.

Another drawback is that the control and address signals supplied to dual-port RAM have stringent and interrelated setup, hold, and other timing requirements, which are not easily satisfied at high operating speeds. This problem is particularly acute when the same control signals are supplied to a plurality of memory devices on a printed circuit board. Board design becomes difficult and powerful signal drivers become necessary; but these drivers generate unwanted electrical noise that can cause other devices on the board to malfunction.

Timing would be easier if all control and address signals were synchronized to a single clock signal, but existing dual-port RAM devices make no provision for this type of synchronization; the clock signal is used only to synchronize serial data output, or serial input and output. Synchronous static RAM devices are known, but their synchronization schemes are not directly applicable to dynamic RAM because row and column addresses are multiplexed in dynamic RAM, whereas they are not multiplexed in static RAM. In addition, if existing static RAM synchronization schemes were to be applied to dynamic RAM, operations such as row address decoding would not begin until after input of the synchronizing clock edge, which would lead to delays inappropriate for a burst-access device.

SUMMARY OF THE INVENTION

It is accordingly an object of the present invention to synchronize address signals, control signals, and data input and output to a single clock signal.

Another object of the invention is to reduce memory size and cost.

Yet another object of the invention is to facilitate the use of memory in multiple-processor systems.

Still another object of the invention is to facilitate the use of memory by different types of processors.

A further object of the invention is to facilitate image-processing operations.

An additional object of the invention is to enable rapid word-line driving in a synchronous memory.

A synchronous burst-access memory comprises a memory cell array having memory cells disposed in intersecting rows and columns for storing data, and a latching means for latching a row address strobe signal, a column address strobe signal, and address signals in synchronization with a clock signal. The latching means also generates first and second internal control signals from the latched signals.

An input/output means performs external input and output of data in synchronization with the clock signal.

A row address decoding means decodes the address signals and selects a row of memory cells in the memory cell array in response to the first internal control signal.

An address counting means is preset to a value determined by the address signals in response to the second internal control signal. The address counting means then counts the clock signal and generates a consecutive series of column addresses starting from the present value. A column address decoding means decodes the series of column addresses and selects corresponding columns in the memory cell array.

A data transfer means transfers data from the input/output means to the memory cell array and from the memory cell array to the input/output means. The data are transferred to and from memory cells disposed in columns selected by the column address decoding means, in the row selected by the row address decoding means.

A word-line driving circuit for a synchronous memory uses transparent latches to latch the row address strobe signal and address signals, enabling row address decoding to be completed prior to synchronization with the clock signal.

BRIEF DESCRIPTION OF THE DRAWINGS

FIG. 1A illustrates a portion of the memory cell array shown in FIG. 1 in enlarged form.

FIG. 9A illustrates a block addressing scheme.

FIGS. 9B–9H are timing diagrams illustrating burst access to three blocks in FIG. 9A by the fourth novel memory.

FIG. 11A illustrates two groups of three blocks each in the fifth novel memory.

FIGS. 11B–11G are timing diagrams illustrating burst access to the blocks indicated in FIG. 11A by the fifth novel memory.

FIG. 12 is a block diagram of a sixth novel synchronous burst-access memory.

FIGS. 13B–13J are timing diagrams illustrating burst access to the blocks indicated in FIG. 13A by the fifth novel memory.

FIGS. 18A–18C are timing diagrams illustrating the operation of the flag-shifting circuit.

FIG. 19A–19J are timing diagrams illustrating the operation of the eighth novel synchronous burst-access memory when the SFT signal is high.

FIGS. 20A–20J are timing diagrams illustrating the operation of the eighth novel synchronous burst-access memory when the SFT signal is low.

FIGS. 22A–22O are timing diagrams illustrating operation of the novel word-line driving circuit.

DETAILED DESCRIPTION OF THE INVENTION

Eight embodiments of the invented burst-access synchronous memory will be described with reference to FIGS. 1 to 20, and then a novel word-line driving device for use in synchronous dynamic RAM will be described with reference to FIGS. 21 and 22. The drawings are intended to illustrate the invention but not to limit its scope, which should be determined solely from the appended claims.

Figure 1:
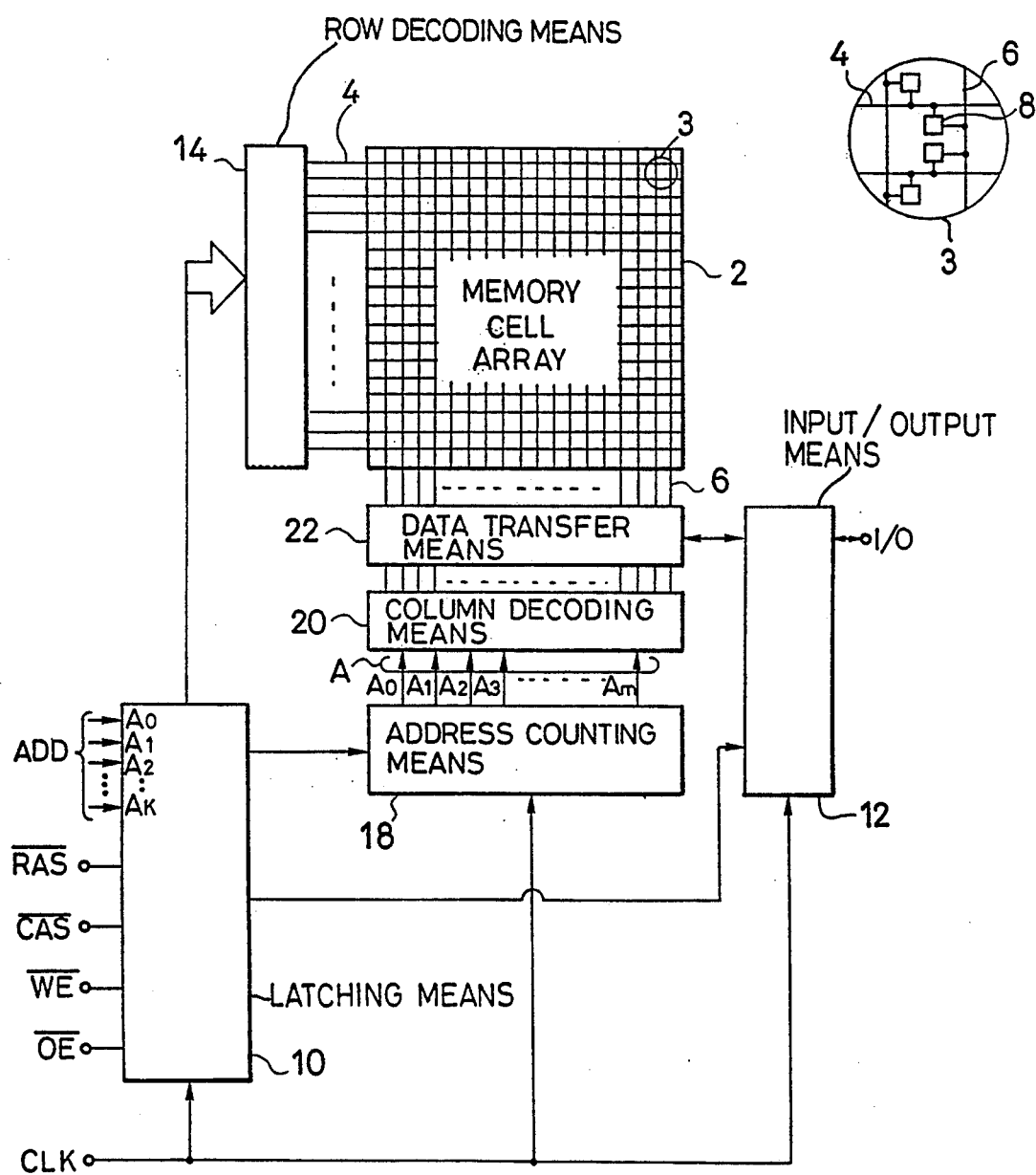
FIG. 1 is a block diagram of a first novel synchronous burst-access memory.

With reference to FIG. 1, a first novel synchronous burst-access memory comprises a memory cell array 2 having memory cells disposed in intersecting rows and columns. In the drawing, rows are represented by horizontal word lines 4 and columns by vertical bit lines 6. Dynamic random-access memory cells 8 are disposed near the intersections of the bit lines and word lines, as shown in FIG. 1A for example FIG. 1A illustrates the circled region identified by reference number 3 in FIG. 1 in enlarged form. The memory cell array also comprises sense amplifiers and other well-known devices not explicitly shown in the drawings.

The novel memory also has a latching means 10, clocked by a clock signal CLK, for receiving and latching a row address strobe signal $\overline{RAS}$, a column address strobe signal $\overline{CAS}$, and address signals $A_0, A_1, A_2, \ldots, A_k$, which are carried on an external address bus ADD. The memory must also receive one or more signals for differentiating between read access and write access. In FIG. 1 the latching means 10 receives and latches for this purpose a write enable signal $\overline{WE}$ and an output enable signal $\overline{OE}$.

A novel feature of the invention is that $\overline{RAS}$, $\overline{CAS}$, $\overline{WE}$, $\overline{OE}$, and the address signals $A_0, \ldots, A_k$ are all latched on rising or falling edges of the clock signal CLK. The external circuits that generate $\overline{RAS}$, $\overline{CAS}$, $\overline{WE}$, $\overline{OE}$, and the address signals accordingly need only satisfy setup and hold time requirements with respect to CLK, instead of having to meet the complex, interrelated timing requirements of conventional dynamic RAM or dual-port RAM. As a result there are comparatively liberal margins for timing skew, and timing requirements can be met by external signal-driving circuits of only moderate output, even at high clock speeds. Prior-art problems of noise on printed circuit boards can therefore be avoided.

The latching means 10 comprises latch circuits for latching the above-mentioned input signals, and further circuitry for passing the latched input signals to other parts of the burst-access synchronous memory, and for generating various control signals from the latched input signals. Transparent latches can be used advantageously, as will be shown later in FIGS. 21 and 22.

The invention is not restricted to the signals shown in FIG. 1. There may be two column address strobe signals ($\overline{UCAS}$ and $\overline{LCAS}$, for strobing an upper and lower column address), for example, or two write enable signals ($\overline{UWE}$ and $\overline{LWE}$). Alternatively, $\overline{WE}$ and $\overline{OE}$ may be replaced by a single read/write signal ($R/\overline{W}$). The necessary modifications will be obvious to one skilled in the art.

An input/output means 12, also clocked by the clock signal CLK, is connected to and controlled by the latching means 10. The input/output means has a data I/O port (marked I/O in the drawings) via which data are input to and output from the memory in serial fashion, synchronized with CLK. When not used for data input or output, the I/O port is placed in the high-impedance state.

The I/O port may comprises a single signal line as shown in the drawing, in which case only one data bit is input or output at a time. Alternatively, the I/O port may comprise more than one signal line, in which case two or more data bits are input or output simultaneously. The number of bit lines (actually bit line pairs) per column in the memory cell array equals the number of data lines in the I/O port.

A row address decoding means 14 connected to the memory cell array 2 and the latching means 10 receives the latched address signals $A_0, \ldots, A_k$ and a first internal control signal from the latching means 10, decodes the address information, thereby selects one of the word lines 4, and drives this word line, thus selecting a row of memory cells in the memory cell array 2. The first internal control signal, which controls the time at which these operations are carried out, is generated from the row address strobe signal $\overline{RAS}$ and the clock signal CLK. Alternatively, $\overline{RAS}$ and CLK may be passed directly to the address decoding means 14 as the first internal control signal.

An address counting means 18 is connected to and controlled by the latching means 10 and receives the clock signal CLK. By counting CLK pulses, the address counting means 18 generates a consecutive series of column addresses (A) starting from a preset address as will be described later. Each address A comprises m address bits $A_0, A_1, A_2, \ldots, A_m$. The address counting means 18 thus operates as a presettable (m+1)-bit counter. The number of address bits $A_0, \ldots, A_m$ generated is equal to or greater than the number of address bits $A_0, \ldots, A_k$ latched by the latching means 10.

A column address decoding means 20 connected to the address counting means 18 decodes the column addresses output by the address counting means 18 and selects corresponding columns in the memory cell array 2, selecting one column at a time.

A data transfer means 22, connected to the memory cell array 2, the input/output means 12, and the column address decoding means 20, transfers data from the memory cell array 2 to the input/output means 12, and from the input/output means 12 to the memory cell array 2. The data are transferred to and from only those memory cells 8 disposed in the column selected by the column address decoding means 20, in the row selected by the row address decoding means 14. Data are thus transferred to or from a consecutive series of column positions in the row, one column position at a time.

Figure 2:
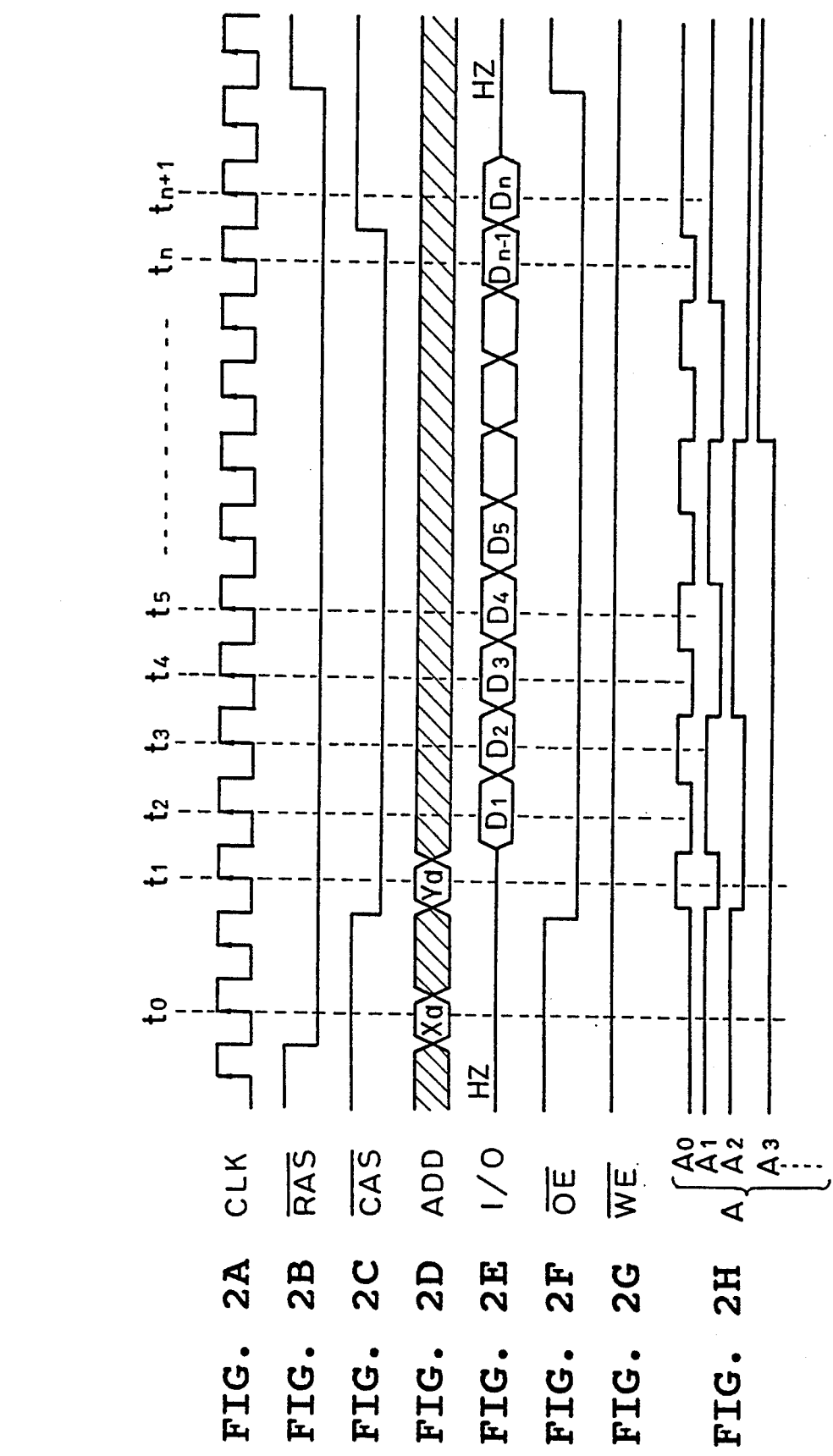
FIGS. 2A-2H are timing diagrams illustrating the operation of the first novel memory.

The operation of this memory will be explained with reference to FIG. 2, which illustrates a burst read access.

To read data from the novel memory, an external device such as a processor begins by driving $\overline{RAS}$ low (active) and sending a row address Xa on the address bus ADD. At time $t_0$ the latching means 10 latches $\overline{RAS}$ and the row address Xa. The row address decoding means 14 decodes Xa and selects one of the word lines 4 in the memory cell array 2.

This and other latching operations are shown synchronized to rising edges of the clock signal CLK, but the invention is of course not restricted to the rising edge; synchronization may be with the falling edge instead, or with both edges.

Next the processor drives $\overline{CAS}$ and $\overline{OE}$ low (active) and sends a column address Ya on the address bus ADD. At time $t_1$ the latching means 10 latches $\overline{CAS}$ and $\overline{OE}$ and sets the value of Ya in the address counting means 18. The column address Ya may be latched in the latching means 10, using a latch separate from the latch that holds the row address Xa. Alternatively, the column address Ya may be passed directly through the latching means 10 to the address counting means 18. In either case, the column address Ya is passed to the address counting means 18 together with a second internal control signal commanding the address counting means 18 to preset to the value Ya. The second internal control signal can be generated from $\overline{CAS}$ and CLK: for example, from the first rising edge of CLK after $\overline{CAS}$ goes low.

If the number of address bits $A_0, \ldots, A_m$ output from the address counting means 18 exceeds the number of address bits $A_0, \ldots, A_k$ received by the latching means 10, the column address Ya is set in the k+1 most significant bits of the m+1 bits of the address counting means 18, and the other bits are cleared to zero. From $\overline{CAS}$ and $\overline{OE}$ the latching means 10 also generates and sends to the input/output means 12 a signal commanding the input/output means 12 to commence output operations.

The column address decoding means 20 decodes the column address $A_0, \ldots, A_m$ output by the address counting means 18, thereby selecting one column in the memory cell array. The data transfer means 22 transfers the data $D_1$ in the memory cell or cells at the intersection of this column and the row selected by the row address decoding means 14 to the input/output means 12 for output at the I/O port. The processor can latch the data $D_1$ at time $t_2$.

The address counting means 18 now increments by one, selecting the next column, and the data $D_2$ in this column in the selected row are output in the same way at time $t_3$. Operation continues in this way at times $t_4, t_5, \ldots, t_n$. At each CLK cycle the address counting means 18 increments by one and a new column of data in the same row is output.

After receiving data n−1 times, the processor drives $\overline{CAS}$ high (inactive) again. At time $t_{n+1}$ the latching means 10 latches the inactive $\overline{CAS}$ signal and sends the input/output means 12 an internal control signal commanding it discontinue output operations. When the last data $D_n$ has been output, the input/output means 12 places the I/O port in the high-impedance state, denoted HZ in the drawings. The processor then drives $\overline{RAS}$ and $\overline{OE}$ high (inactive) to end the burst access.

To write data to the novel memory, the processor follows a similar procedure except that it leaves $\overline{OE}$ high and drives $\overline{WE}$ low, causing the input/output means 12 to perform input instead of output. Data provided by the processor in synchronization with the clock signal CLK are transferred from the I/O port via the data transfer means 22 to successive columns of memory cells in the selected row in the memory cell array 2.

If the I/O port consists of a single signal line, then each of the data $D_1, \ldots, D_n$ consists of a single bit. If the I/O port consists of multiple signal lines, then each of the data $D_1, \ldots, D_n$ consists of multiple bits.

In its simplest and generally preferable form the data transfer means 22 comprises only gating means for connecting bit lines 6 in the selected column to the input/output means 12. If necessary, however, the data transfer means 22 may have a data register as in conventional dual-port RAM. In this case an entire row of data is transferred from the selected word line to the data transfer means 22 at the beginning of the burst access, between times $t_0$ and $t_1$ in FIG. 2, and stored in the data register. The data in the data register are then written or read at times $t_1$ to $t_{n+1}$. For write access, after time $t_{n+1}$ the entire row of data is transferred back from the data transfer means 22 to the selected row in the memory cell array 2.

Since address signals $(A_0, \ldots, A_k)$ and control signals ($\overline{RAS}, \overline{CAS}, \overline{WE}, \overline{OE}$) are sent to the memory only once per burst, access takes place much more rapidly than with conventional dynamic RAM, new data being obtained in every clock cycle. Since the novel memory has only one port, it is smaller, simpler, and less expensive to manufacture and test than conventional dual-port RAM. It is also simpler to control.

Unlike conventional dual-port RAM, the novel memory does not enable random and serial access to be performed simultaneously. Many personal computer systems and other systems that employ dual-port RAM do not need to access the two ports simultaneously, however. Such systems will obtain significant cost benefits from using the novel memory.

Figure 3:
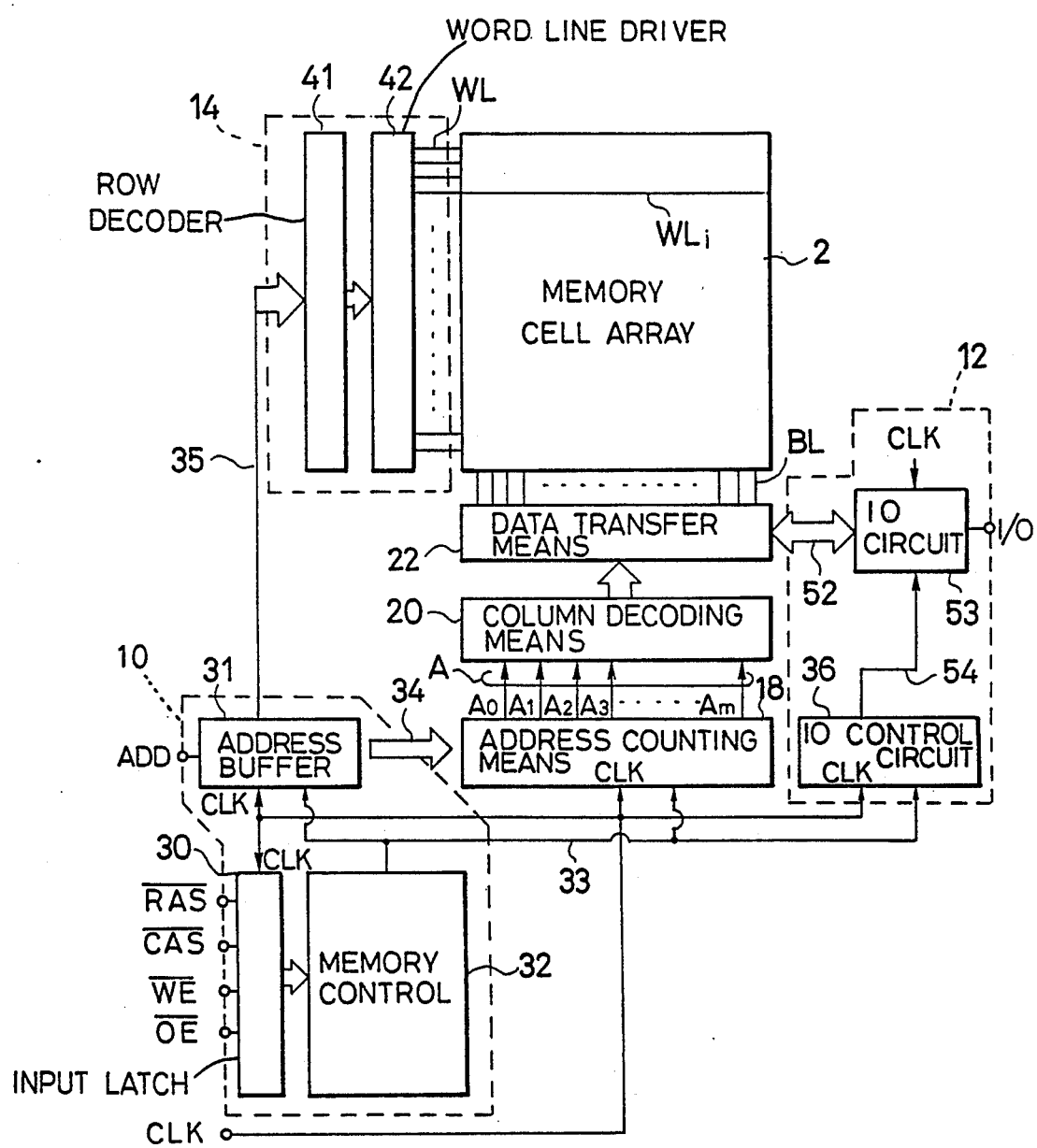
FIG. 3 is a more detailed block diagram of the first novel memory.

FIG. 3 is a somewhat more detailed block diagram of the first novel memory. FIG. 3 is shown mainly to relate the foregoing description to the descriptions of subsequent novel memories, in which further elements will be added.

In FIG. 3 the latching means 10 is shown to comprise an input latch circuit 30 for latching $\overline{RAS}, \overline{CAS}, \overline{WE}$, and $\overline{OE}$, and an address buffer 31 connected to the external address bus ADD for latching address signals. A memory control signal generating circuit 32 connected to the output side of the input latch circuit 30 generates internal control signals, and controls the address buffer 31 so that row addresses are sent to the row address decoding means 14 and column addresses to the address counting means 18. Control signals from the memory control signal generating circuit 32 are conveyed to the address buffer 31, the address counting means 22, and the input/output means 12 via several signal lines which are shown for convenience in the drawings as a single signal line 33.

The output side of the address buffer 31 is connected via an internal column address bus 34 to the address counting means 18, and via an internal row address bus 35 to the row address decoding means 14. The row address decoding means 14 comprises a row address decoder 41 and a word-line driver 42. The row address decoder 41 decodes the row address received from the address buffer and selects one of the word lines, such as $WL_i$ in the drawing. The word-line driver 42 drives the selected word line $WL_i$.

The input/output means 12 comprises an input/output control circuit 36 and an input/output circuit 53, both of which receive the clock signal CLK. The input/output circuit 53 is connected to the data transfer means 22 via an internal data bus 52 comprising one or more data lines, which are connected via well-known buffer circuits not explicitly shown in the input/output circuit 53 to the equal number of data lines in the I/O port. The input/output control circuit 36 receives control signals from the memory control signal generating circuit 32 via the signal line 33, and sends further control signals to the input/output circuit 53 via a signal line 54. These further control signals place the input/output circuit 53 in the input state, the output state, or a high-impedance state in which neither input nor output is performed.

Figure 4:
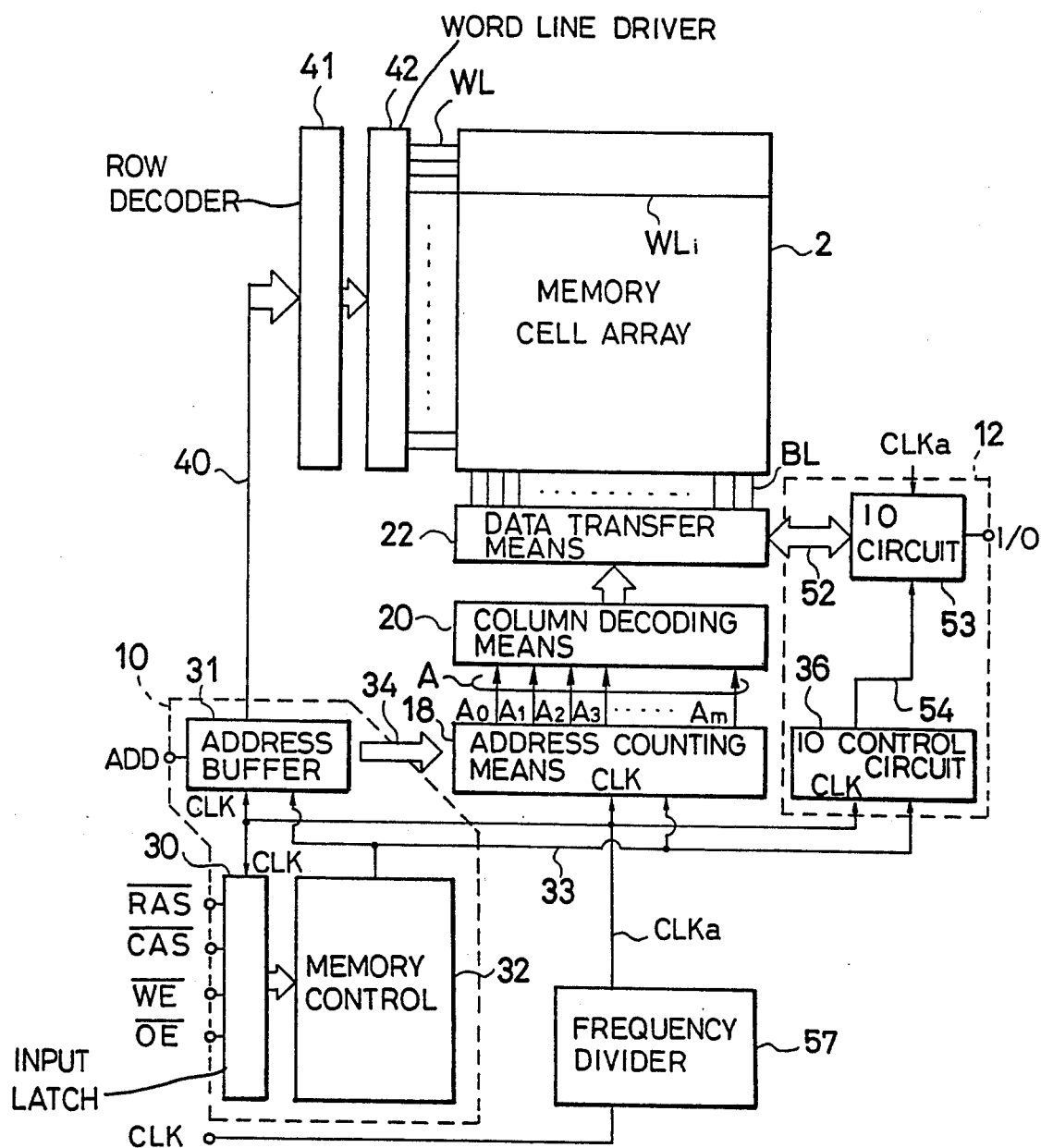
FIG. 4 is a block diagram of a second novel synchronous burst-access memory.

FIG. 4 is a block diagram of a second novel synchronous burst-access memory. Elements identical to elements in FIG. 3 are identified by the same reference numerals.

The second novel memory differs from the first novel memory in having a frequency divider 57 that receives the clock signal CLK, divides its frequency by a factor N (where N is a positive integer), thus generates an internal clock signal CLKa, and supplies CLKa in place of CLK to the input latch circuit 30, the address buffer 31, the address counting means 18, the input/output control circuit 36, and the input/output circuit 53. Frequency dividing circuits are well known, so a detailed description will be omitted. The frequency division ratio N can be selected by one or more external control signals not shown in the drawing. Alternatively, N can be permanently selected when the memory is fabricated, by a manufacturing option such as a metalization mask option, laser trimming option, or wire bonding option.

Figure 5:
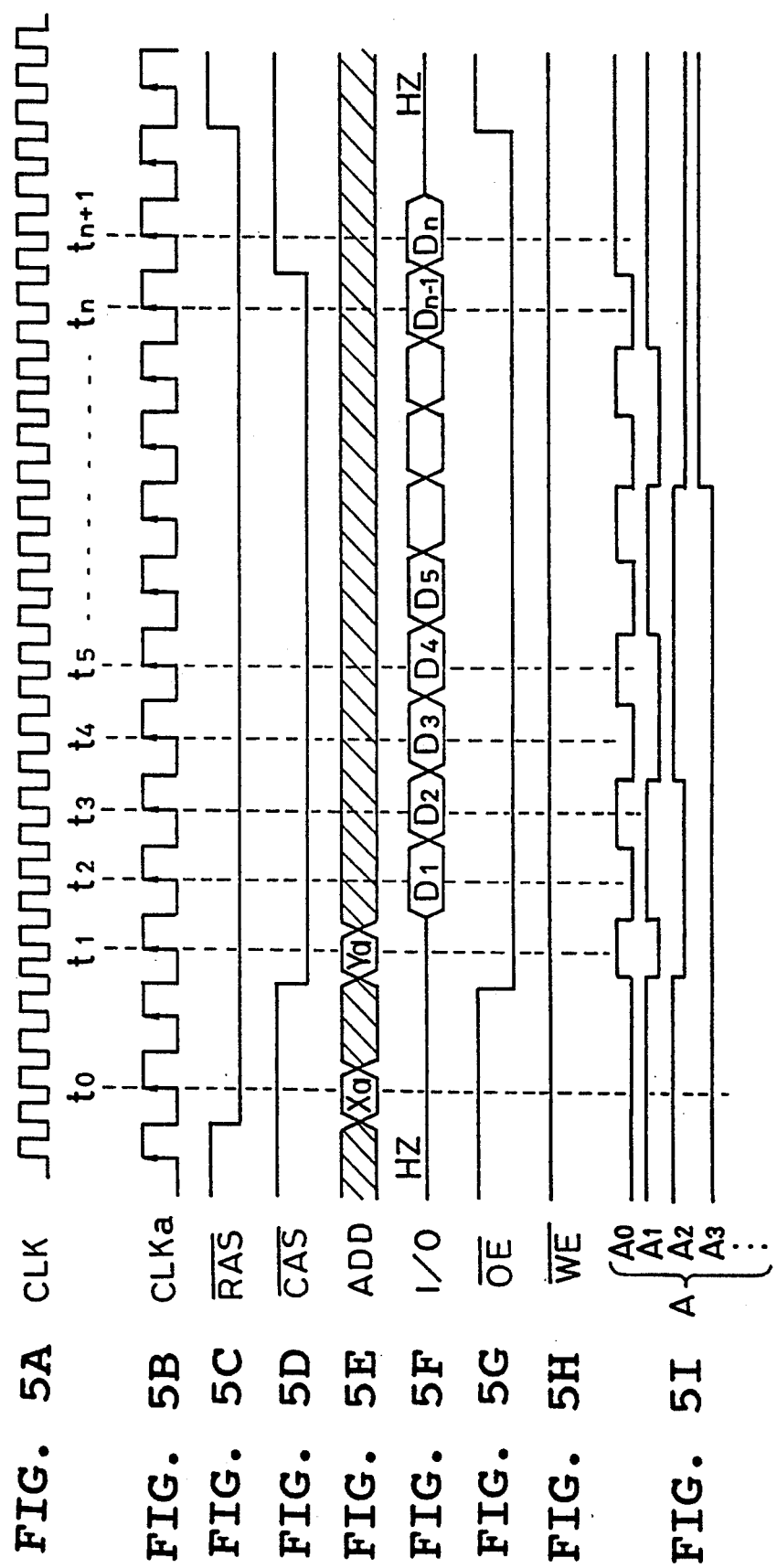
FIGS. 5A-5I are timing diagrams illustrating the operation of the second novel memory.

FIG. 5 illustrates burst access for the case of N=2. For convenience the external clock signal CLK is shown as having twice the frequency of the CLK signal in FIG. 2. The CLKa signal obtained by dividing the frequency of CLK by two accordingly has the same frequency in FIG. 5 as CLK in FIG. 2. The burst access shown in FIG. 5 is identical to that in FIG. 2 except that CLK is replaced by CLKa.

While some processors are capable of completing one memory access in every clock cycle, others require two or more clock cycles per access. The frequency divider 57 enables the novel memory in FIG. 4 to be easily adapted for use with processors having different access speeds. Users will benefit by not having to provide a separate clock-dividing circuit. Manufacturers will benefit by being able to offer a single memory device suitable for a wide range of applications.

If the frequency division ratio N is controllable by external signal input, the second novel memory can be used in a system having two or more processors that access memory at different speeds. When accessing the memory, each processor selects the appropriate value of N by driving the external control signal or signals to the appropriate levels.

Figure 6:
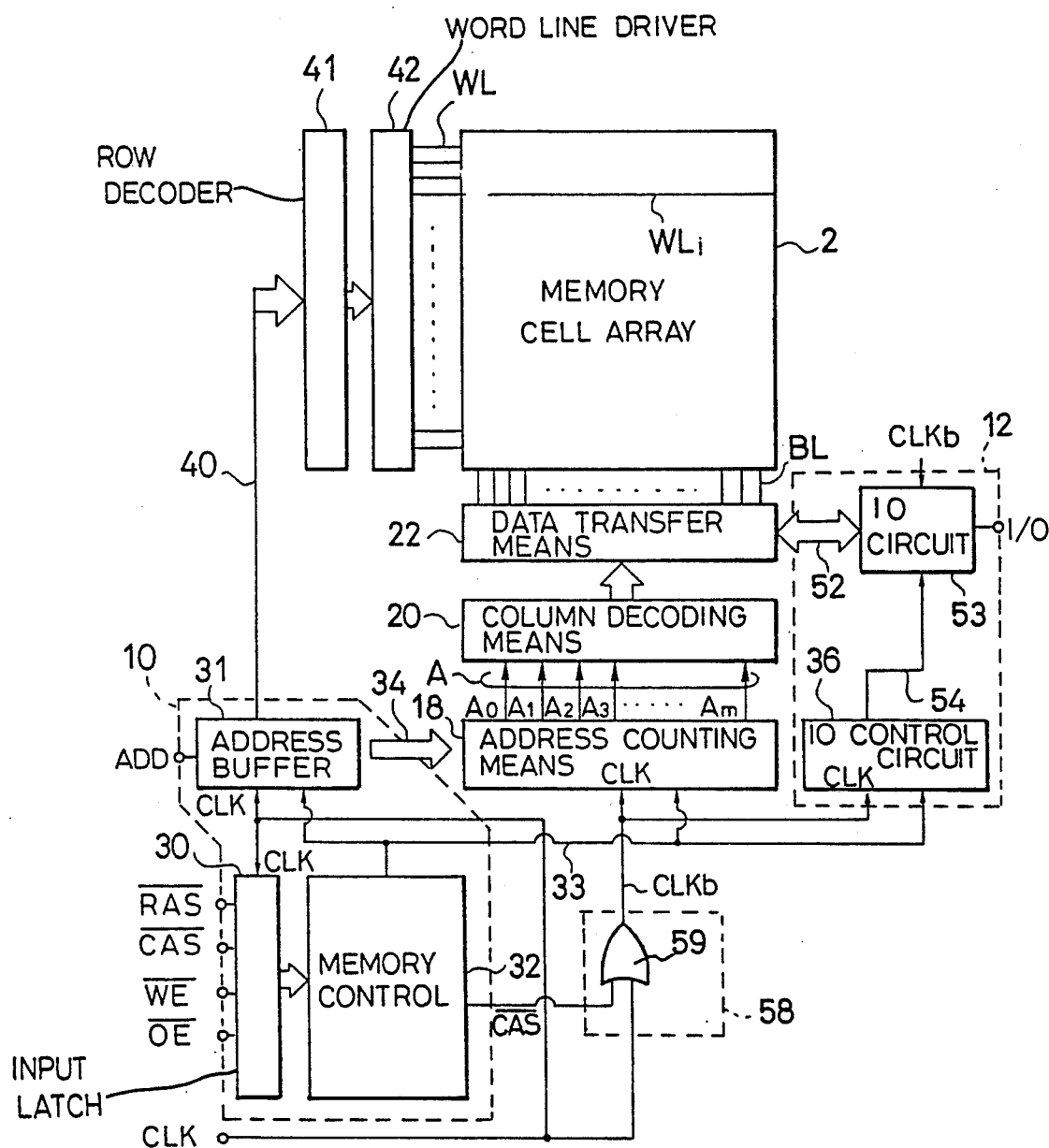
FIG. 6 is a block diagram of a third novel synchronous burst-access memory.

FIG. 6 is a block diagram of a third novel synchronous burst-access memory. Elements identical to elements in FIG. 3 are identified by the same reference numerals.

The third novel memory has, in addition to the circuit elements shown in FIG. 3, a clock control circuit 58 for blocking input of the clock signal CLK to the address counting means 18 and the input/output means while $\overline{CAS}$ is high. The clock control circuit comprises, for example, a two-input OR gate 59: one input receives CLK; the other receives $\overline{CAS}$ from the memory control signal generating circuit 32. The output CLKb of the OR gate 59 is thus high whenever $\overline{CAS}$ is high, and is identical to CLK when $\overline{CAS}$ is low. CLKb is supplied to the address counting means 18, the input/output control circuit 36, and the input/output circuit 53 in place of CLK.

Figure 7:
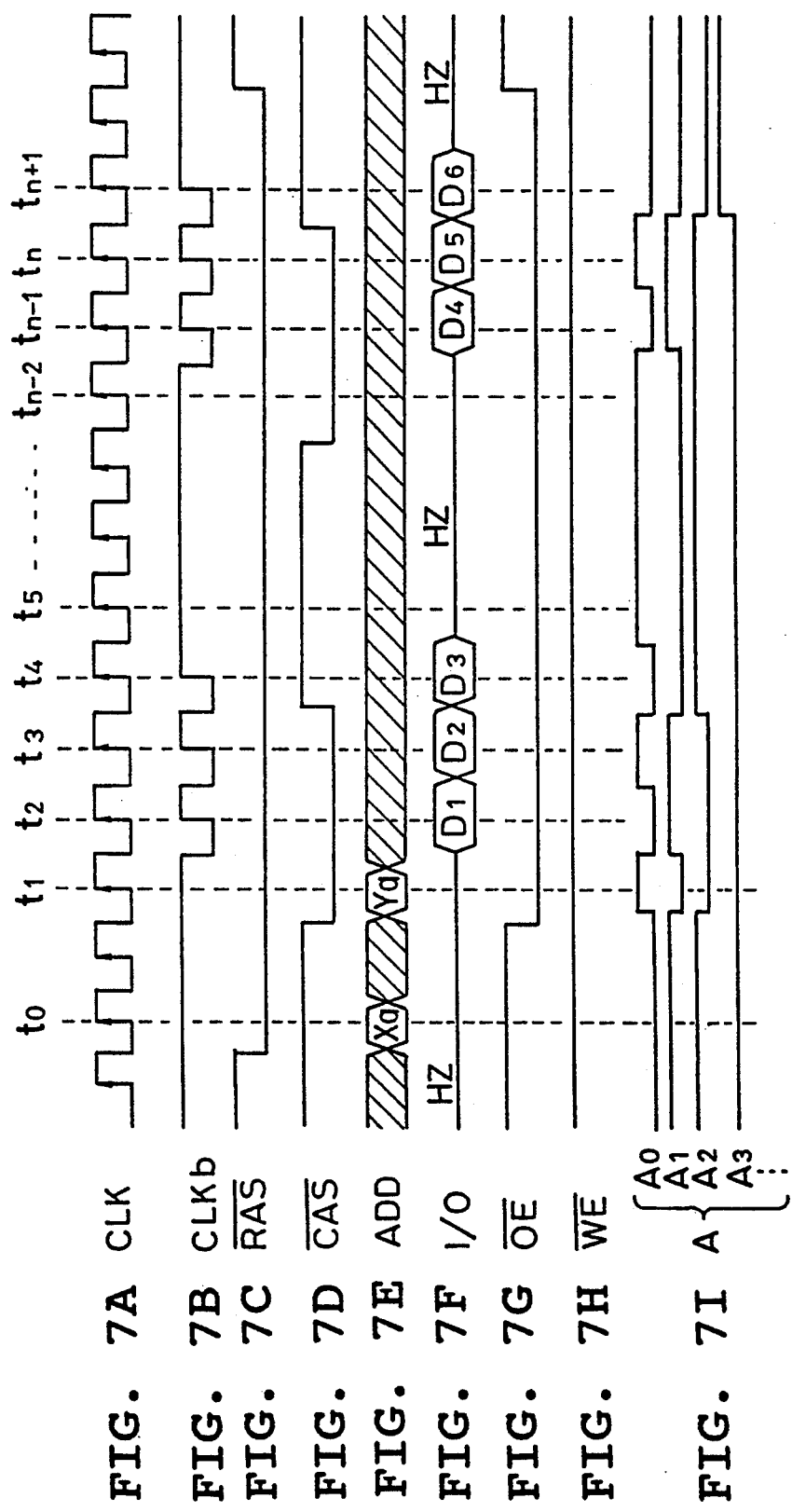
FIGS. 7A-7I are timing diagrams illustrating the operation of the third novel memory.

FIG. 7 illustrates a burst read access for the third novel memory. $\overline{CAS}$ is initially held low for substantially three CLK cycles, causing the clock control circuit 58 to generate three CLKb pulses. Data $D_1$, $D_2$, and $D_3$ are output and the address counting means 18 increments three times. Next $\overline{CAS}$ is held high for substantially four CLK cycles, causing CLKb to remain high for a similar interval. During this interval the address counting means 18 does not increment, and a third internal control signal generated by the memory control signal generating circuit 32 causes the input/output control circuit 36 to place the input/output circuit 53 in the high-impedance state. $\overline{RAS}$ remains low; the same word line remains selected in the memory cell array 2. Next $\overline{CAS}$ is driven low for three CLK cycles again, causing three more CLKb pulses to be produced, the address counting means 18 to increment three times, and the data $D_4$, $D_5$, and $D_6$ to be output. Finally, both $\overline{CAS}$ and $\overline{RAS}$ are driven high, ending the burst access.

Write access is similar to read access except that $\overline{WE}$ is driven low instead of $\overline{OE}$.

The third novel memory is particularly useful in systems in which the same data bus is shared by two or more processors or other bus-master devices. While a first processor is engaged in a long burst access, a second processor may obtain use of the bus by asking the first processor to release the bus temporarily. The first processor does so by driving $\overline{CAS}$ high. When the second processor has finished using the bus, the first processor continues its access by driving $\overline{CAS}$ low again without having to generate new address information.

Figure 8:
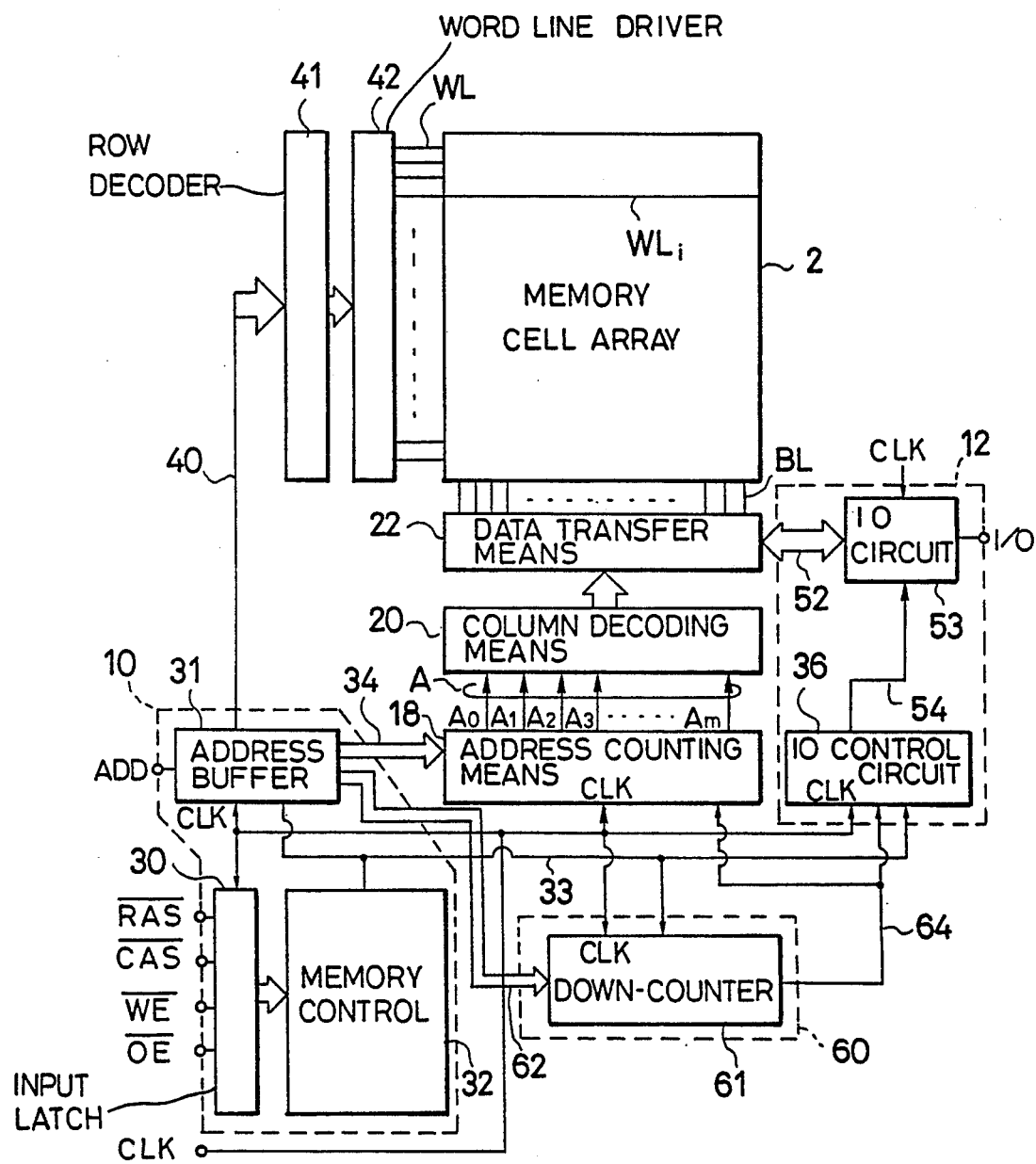
FIG. 8 is a block diagram of a fourth novel synchronous burst-access memory.

FIG. 8 is a block diagram of a fourth novel synchronous burst-access memory. Elements identical to elements in FIG. 3 are identified by the same reference numerals.

The fourth novel memory has an access counting means 60 for counting clock signals and halting input or output when a predetermined number of accesses have been performed. In FIG. 8 the access counting means 60 comprises a down-counter 61 connected to the address buffer 31 via an internal address bus 62, to the memory control signal generating means 32 via the signal line 33, and to the address counting means 18 and the input/output control circuit 36 via a signal line 64. The down-counter 61 preferably has the same bit width as the address counting means 18.

In this fourth novel memory the bit width of the external address bus ADD differs from the bit width of the address counting means 18 and the down-counter 61. As an example, it will be assumed that $m = k + 2$.

When $\overline{CAS}$ becomes active for the first time after $\overline{RAS}$ becomes active, the value $A_O, \ldots, A_K$ input to the address buffer 31 on the next rising edge of CLK presets the most significant bits of the address counting means 18, the two remaining bits $A_{K+1}$ and $A_{K+2}$ of the address counting means 18 being cleared to zero as mentioned earlier. After this, while $\overline{RAS}$ remains active, if $\overline{CAS}$ becomes inactive, then active for a second time, the value $A_O, \ldots, A_K$ input to the address buffer 31 on the next rising edge of CLK presets the $k+1$ most significant bits of the down-counter 61, without affecting the remaining bits of the down-counter 61. These presetting operations are controlled by internal control signals provided by the memory control signal generating means 32.

FIG. 9A shows the address structure of the memory cell array 2 in the fourth novel memory. For simplicity it will be assumed that the I/O port and the internal data bus 51 consist of only a single data line each, so that the memory cell array 2 has one bit per column. This is not a restriction on the invention; the structure can easily be extended to multiple bits per column.

A given row address X input to the memory designates a single word line, but a $(k+1)$-bit column address Y designates four bits (four columns) in that word line, such a group of four bits being referred to herein as a block. The four bits in the block corresponding to row address $X_1$, column address $Y_1$ are identified by circles with different quadrant markings, and bits in the two succeeding blocks are similarly identified. Burst access to these twelve bits will be illustrated next.

FIG. 9B illustrates a burst read access for the fourth novel memory. The row address $X_1$ is latched at time $t_1$ and the column address $Y_1$ at time $t_2$. The address counting means 18 is preset with $Y_1$ in the most significant $k+1$ bits and zero in the two remaining bits. At the same time the down-counter 61 is cleared to zero.

The address counting means 18 now begins incrementing, generating column addresses that select individual bits in the memory cell array. In the first four clock cycles after $t_2$ the four bits in block $(X_1, Y_1)$ are selected for access, one after another; in the next four clock cycles the four bits in the block $(X_1, Y_1+1)$ are selected and accessed; then the four bits in the block $(X_1, Y_1+2)$ are selected and accessed.

In the meantime, in the next clock cycle after $t_2$ the processor drives $\overline{CAS}$ high; then it drives $\overline{CAS}$ low again and places an access count on the external address bus ADD, indicating the number of blocks to be accessed. In this example the access count is $N=3$. This value is transferred from the address buffer 31 to the most significant $k+1$ bits of the down-counter 61 at time $t_3$.

At the moment when this value is transferred from the address buffer 31 to the down-counter 61, the down-counter 61 has already decremented from zero to, for example, minus two: in binary notation, from $(00 \ldots 00000)_B$ to $(11 \ldots 11110)_B$. The value $(10)_B$ in the two least significant bits is left unaltered and the value three, or $(00 \ldots 011)_B$, is set in the other bits, so the complete value of the down-counter 61 becomes, for example, $(00 \ldots 01110)_B$ or fourteen.

The down-counter 61 is designed to generate a count-out signal when its count reaches a certain value: for example, the value three, or $(00 \ldots 00011)_B$, at which the most significant $k+1$ bits all become zero. This value should be selected so that it is reached when the requested number of blocks have been accessed. The count-out signal (referred to elsewhere as a fourth internal control signal) is sent via the signal line 64 to the address counting means 18 and the input/output control circuit 36 in FIG. 8, causing the address counting means 18 to stop counting and the input/output control circuit 36 to place the I/O port in the high-impedance state. After this, the processor drives $\overline{CAS}$ and other control signals inactive.

Write access is similar to read access except that $\overline{WE}$ is driven low instead of $\overline{OE}$.

The fourth novel memory has the same advantages as the first novel memory, with the following additional advantages.

In read access, the I/O port is placed in the high-impedance state as soon as the necessary number of bits have been accessed, even if the processor does not immediately deactivate $\overline{CAS}$ and other control signals. This feature is useful in a system having a shared data bus, since it enables the data bus to be transferred promptly to another device.

In write access, image-processing operations such as clip and fill can be carried out extremely conveniently. The access count can be used to control the number of bits written, thereby masking bits which are to be left unaltered.

In both read access and write access, the processor can control the number of bits accessed without having to deactivate $\overline{CAS}$ and other control signals at exact times.

The block address structure shown in FIG. 9A enables memory capacity to be increased without increasing either the number of external address lines ($A_0, \ldots A_k$) or the number of data lines in the I/O port, and furthermore enables access to begin even before the access count is received. Similar block structures can be employed in the first, second, and third novel memories.

The fourth novel memory can easily be adapted to block structures in which all bits in the same block are disposed in the same column and have the same column address $A_0, \ldots, A_m$, but are accessed in a serial manner by the input/output means. In this case k and m may be equal, the address counting means 18 being, for example, an $(m+3)$-bit counter that outputs only the $m+1$ most significant bits $A_0, \ldots, A_m$, so that the column address changes only once every four clock cycles.

The inventive concept of the fourth novel memory is also applicable to memories having a non-blocked address structure. In this case the start of data input or output may be delayed until the access count has been preset in the down-counter 61.

Figure 10:
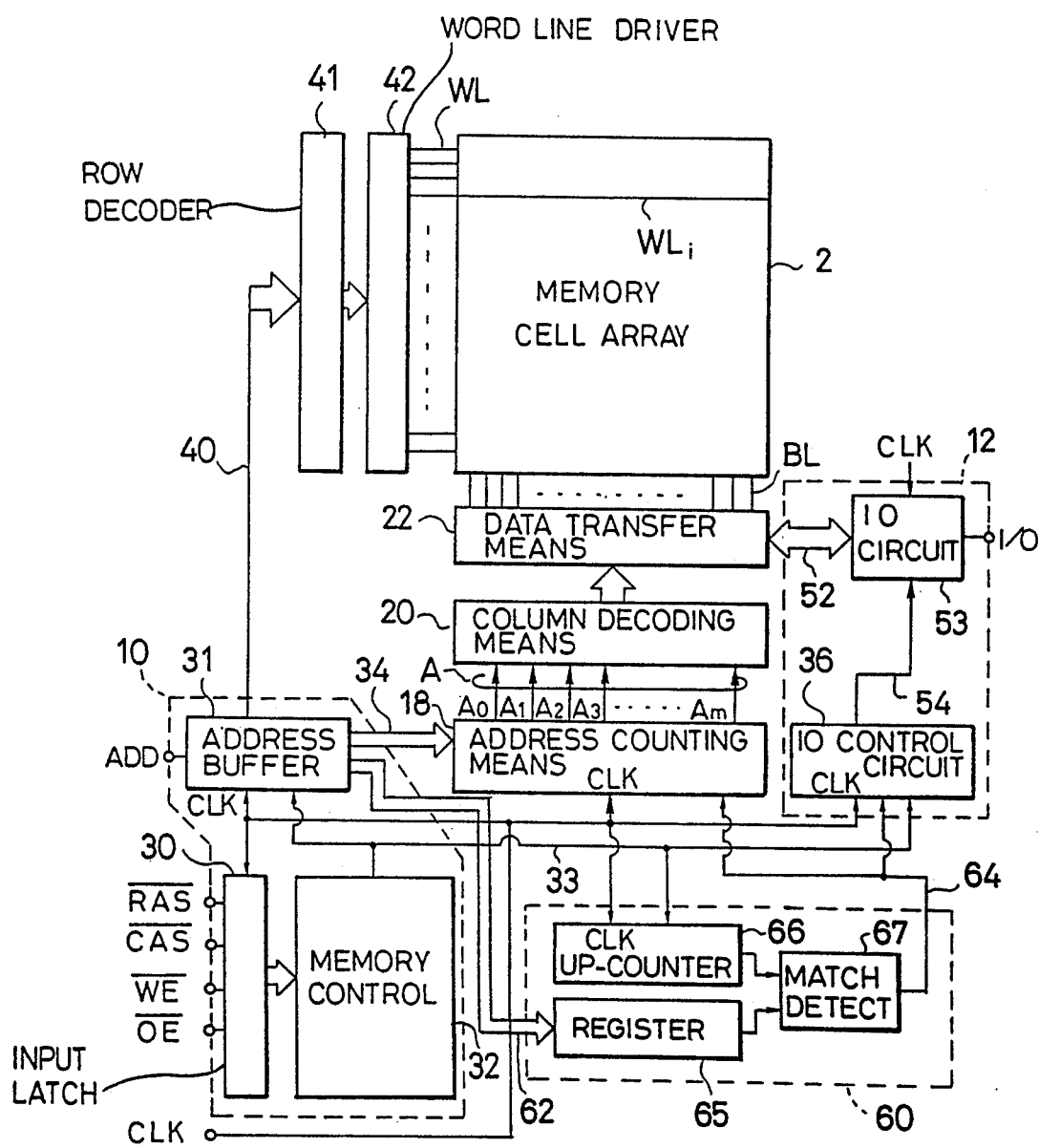
FIG. 10 is a block diagram of a fifth novel synchronous burst-access memory.

FIG. 10 is a block diagram of a fifth novel synchronous burst-access memory. Elements identical to elements in FIG. 8 are identified by the same reference numerals.

The fifth novel memory also has an access counting means 60 for counting accesses and halting input or output when a requested number of accesses have been performed. The difference from the fourth novel memory is that the access counting means 60 comprises a register 65, an up-counter 66, and a match detecting circuit 67, instead of the down-counter 63 in the fourth novel memory. The register 65 and up-counter 66 have the same bit width as the address counting means 18.

The register 65 is connected via the internal address bus 62 to the address buffer 31. As in the fourth novel memory, after $\overline{RAS}$ goes low, when $\overline{CAS}$ goes low for the first time, the memory control signal generating circuit 32 commands the address buffer 31 to send the current address value to the address counting means 18. When $\overline{CAS}$ goes low for the second time, the memory control signal generating circuit 32 commands the address buffer 31 to send the current address value to the register 65. In the case of a block-structured memory, the address values set the most significant $k+1$ bits of the address counting means 18 and the register 65. The register 65 stores the value received from the address buffer 31 until it receives a new value from the address buffer 31, and outputs the stored value to the match detecting circuit 67.

The up-counter 66 counts CLK cycles and outputs the count to the match detecting circuit 67. The up-counter 67 is reset to an initial value such as zero by a control signal generated by the memory control signal generating circuit 32 when $\overline{CAS}$ goes low for the first time after $\overline{RAS}$ goes low.

The match detecting circuit 67 is connected to the address counting means 18 and the input/output control circuit 36 via the signal line 64. The match detecting circuit 67 compares the count output by the up-counter 66 with the value received from the register 65. When this count and value match, the match detecting circuit 67 generates an internal control signal on the signal line 64. This internal control signal (also referred to as a fourth internal control signal) causes the address counting means 18 to stop counting, and the input/output control circuit 36 to place the input/output circuit 53 in the high-impedance state.

The operation of the fifth novel memory will be explained with reference to FIGS. 11A and 11B, which show two twelve-bit burst accesses.

As illustrated in FIG. 11A, the first twelve bits to be accessed are located in three consecutive blocks starting at row address $X_1$, column address $Y_1$. The second twelve bits are located in three consecutive blocks starting at row address $X_2$, column address $Y_2$.

With reference to FIG. 11B, the processor first drives $\overline{RAS}$ low and sends the row address $X_1$, then drives $\overline{CAS}$ low and sends the column address $Y_1$. At time $t_2$ the column address $Y_1$ is passed from the address buffer 31 to the address counting means 18. At the same time, the up-counter 66 is cleared to zero. Output of data now begins as in FIG. 9B, with the up-counter 66 counting the number of bits output.

Next the processor drives $\overline{CAS}$ high for one CLK cycle, then drives $\overline{CAS}$ low again and sends the access block count ($N=3$). At time $t_3$ this count is sent from the address buffer 31 to the register 65 and stored in the most significant bits of the register 65. In this memory the bit width of the address counting means 18, the up-counter 66, and the register 65 is two greater than the bit width of the external address bus, so the value $3 \times 4 = 12$ is stored in the register 65.

When twelve data bits have been output, the output of the up-counter 66 matches the value stored in the register 65. Detecting this match, the match detecting circuit 67 generates a fourth internal control signal that forthwith halts the address counting means 18 and commands the input/output control circuit 36 to place the input/output circuit 53 in the high-impedance state.

At an appropriate later time the processor drives $\overline{RAS}$ and $\overline{CAS}$ high, ending the first access cycle. To access the second twelve bits, the processor next drives $\overline{RAS}$ low and sends a new row address $X_2$, then drives $\overline{CAS}$ low and sends a new column address. These new addresses are latched at times $t_3$ and $t_4$, respectively, and output of the data starting at address ($X_2$, $Y_2$) begins. At time $t_6$ the processor does not have to send the block count ($N=3$) again, because the old count is still held in the register 65. Accordingly, the processor continues to hold $\overline{CAS}$ low from time $t_5$ until the end of the access cycle. Once again, the memory outputs twelve bits, then halts output and places the input/output circuit 53 in the high-impedance state.

Write access is similar to read access except that $\overline{WE}$ is driven low instead of $\overline{OE}$.

The fifth novel memory provides the same advantages as the fourth, with the further advantage that when a processor performs repeated burst accesses of the same length, it only has to specify the length once. A further advantage is that if a processor neglects to specify an access length, because of a programming error for example, this will not in general cause the memory to attempt a burst access of the maximum length, because the previous length will be stored in the register 65 as a default value.

FIG. 12 is a block diagram of a sixth novel synchronous burst-access memory that combines the features of the third and fourth novel memories. Elements identical to elements in FIG. 8 are identified by the same reference numerals.

The sixth novel memory, like the fourth novel memory, has an access counting means 60 comprising a down-counter 61 for counting accesses and halting input or output when a requested count is reached.

The address buffer 31 in FIG. 12 is divided into a first buffer 68 and a second buffer 69. The first buffer 68 supplies a row address to the row address decoder 41 and a column address to the address counting means 18; the second buffer 69 supplies the value on the address bus ADD to the access counting means 60. These operations are performed as already described.

A disabling circuit 70 receives the clock signal CLK, sends control signals to the second buffer 69 and the memory control signal generating circuit 32, and receives a control signal from the memory control signal generating circuit 32. The disabling circuit 70 comprises, for example, a simple counter circuit. The function of the disabling circuit 70 is to enable the access counting means 60 to receive the value on the address bus only during a certain interval after $\overline{CAS}$ first becomes active following activation of $\overline{RAS}$.

When $\overline{CAS}$ goes low for the first time after $\overline{RAS}$ goes low, the memory control signal generating circuit 32 notifies the disabling circuit 70. On the first rising edge of CLK thereafter, the disabling circuit 70 enables the second buffer 69, activates a control signal Pz sent to the memory control signal generating circuit 32, and starts counting CLK cycles. When a certain count (three for example) is reached, the disabling circuit 70 disables the second buffer 69 and deactivates Pz. Here Pz is active high.

The sixth novel memory has a clock control circuit 58 similar to the one in the third novel memory for blocking clock input to the address counting means 18, the input/output control circuit 36, the input/output circuit 53, and the access counting means 60. The control signal sent from the memory control signal generating circuit 32 to the clock control circuit 58 is not $\overline{CAS}$, however, but a signal that blocks CLK only if $\overline{CAS}$ goes high while Pz is low. This signal can be generated, for example, by an AND gate 71 having $\overline{CAS}$ and the inverse of Pz as inputs.

Figure 13A:
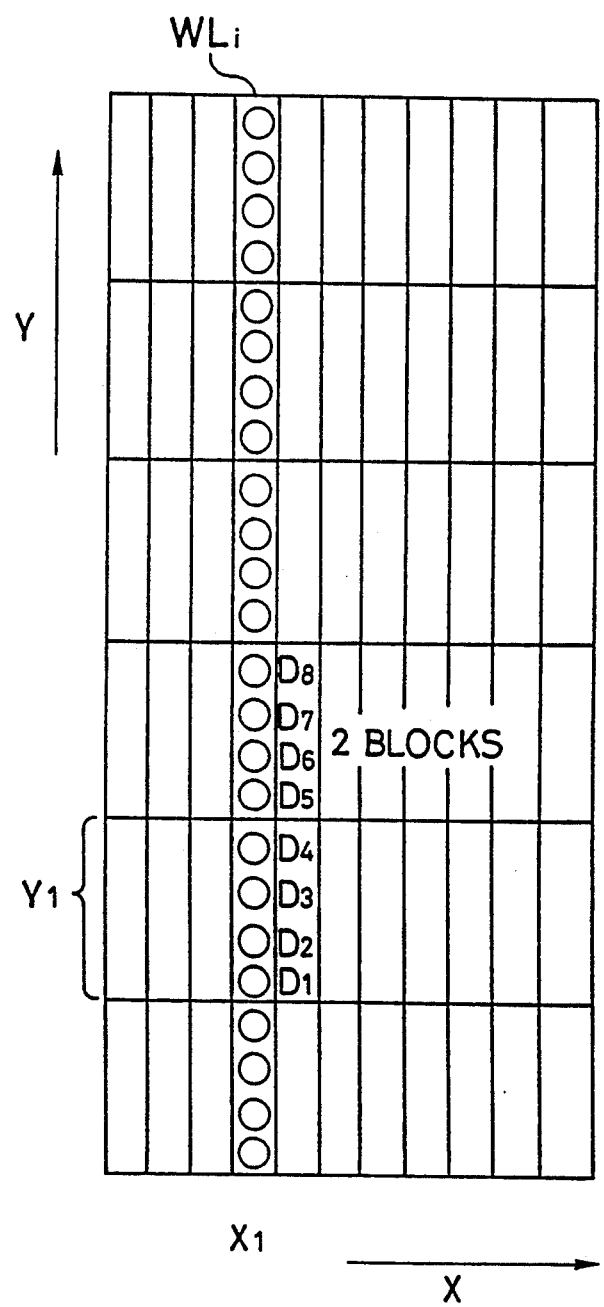
FIG. 13A illustrates two four-bit blocks in the sixth novel memory.

The memory cell array in FIG. 12 has the structure shown in FIG. 13A. Access to the two blocks comprising data $D_1$ to $D_8$ in FIG. 13A will be illustrated next.

Referring to FIG. 13B, access begins as in the fourth and fifth novel memories, the row address $X_1$ being latched at time $t_1$ and the column address $Y_1$ being preset in the address counting means 18 at time $t_2$. At time $t_2$ the disabling means 70 enables the second buffer 69, permitting the block access count (N=2) to be transferred to the access counting means 60 at time $t_3$. Also at time $t_2$, the disabling means 70 drives the Pz signal high and starts counting CLK cycles. $\overline{CAS}$ goes high for one clock cycle between times $t_2$ and $t_3$, but since Pz is high, $\overline{CAS}$ does not block CLK. The address counting means increments normally, and data output begins with $D_1$. Data output continues with $D_2$ and $D_3$ while $\overline{CAS}$ goes low again.

After counting three CLK cycles, the disabling means 70 drives the Pz signal low, permitting CLK to be gated by $\overline{CAS}$. Accordingly, if $\overline{CAS}$ subsequently goes high, as it does for three clock cycles around time $t_4$ for example, the address counting means 18 stops incrementing between times $t_4$ and $t_5$. During this interval the access counting means 60 also stops counting, the I/O port is placed in the high-impedance state on command from the memory control signal generating circuit 32, and access pauses.

Access resumes after time $t_5$, this being the first rising edge of CLK after $\overline{CAS}$ goes low again, and the remaining data $D_4, \ldots, D_8$ are output. When $D_8$ has been output, the access counting means 60 terminates the access by stopping the address counting means 18 and causing the I/O port to be placed in the high-impedance state again.

The sixth novel memory has the advantages of both the third and fourth novel memories: access can be temporarily halted by driving $\overline{CAS}$ high in order to allow another device to use the data bus; the data bus is released promptly when the requested number of bits have been accessed; and in write access, the access count can be used to mask bits in image-processing operations such as clip and fill.

Figure 14:
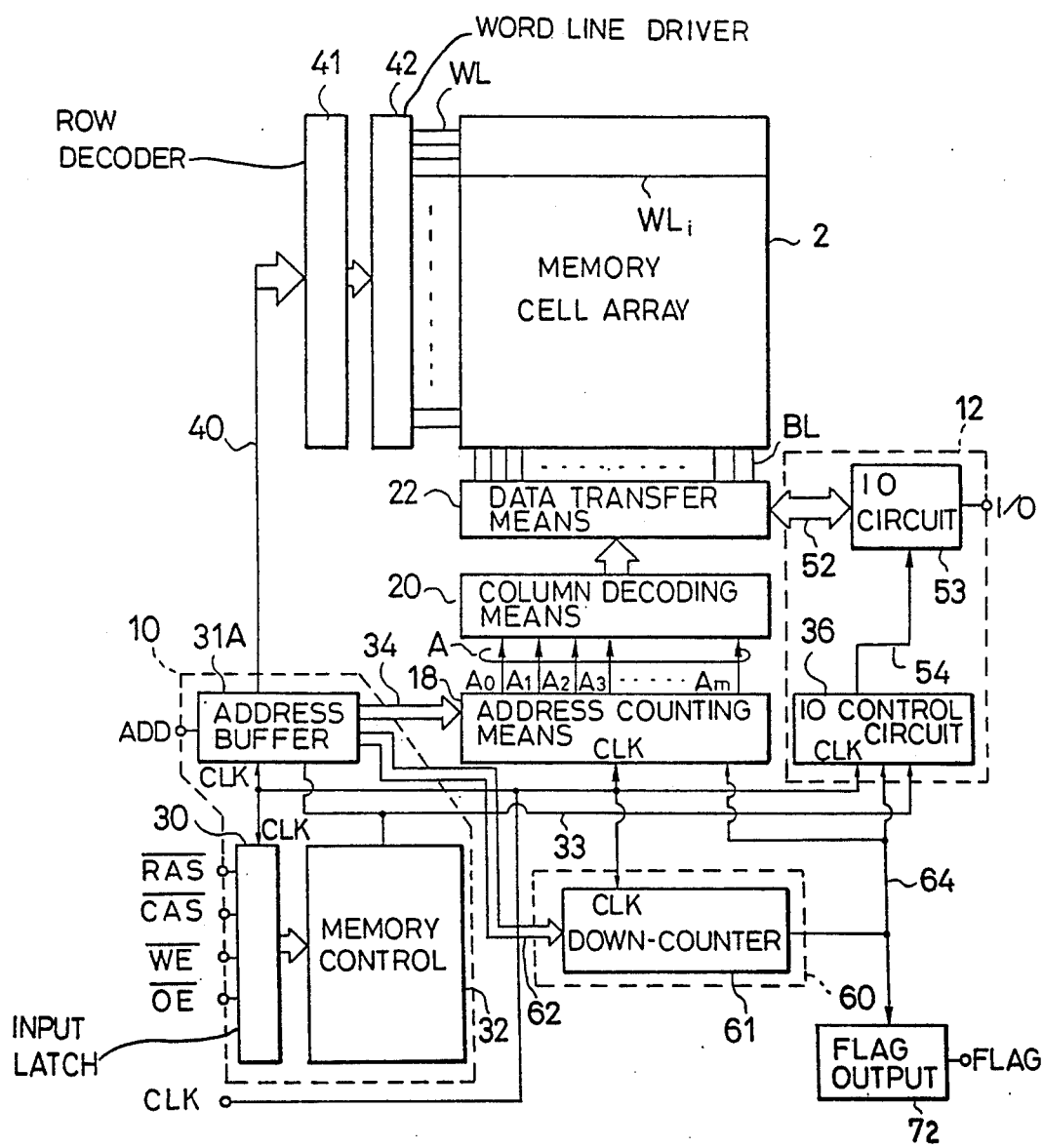
FIG. 14 is a block diagram of a seventh novel synchronous burst-access memory.

FIG. 14 is a block diagram of a seventh novel synchronous burst-access memory. Elements identical to elements in FIG. 8 are identified by the same reference numerals.

This seventh novel memory is similar to the fourth novel memory but has an additional flag output circuit 72 that also receives the signal output by the access clock counting means 60 on the signal line 64 when the requested number of accesses have been performed. On receiving this signal, the flag output circuit 72 asserts an external flag signal denoted FLAG in the drawings to notify external devices that the burst access has ended. The flag output circuit comprises, for example, a flip-flop circuit that is set by the signal from the access counting means 60 and reset (via a signal line not shown in the drawing) when $\overline{RAS}$ goes high.

Figure 15:
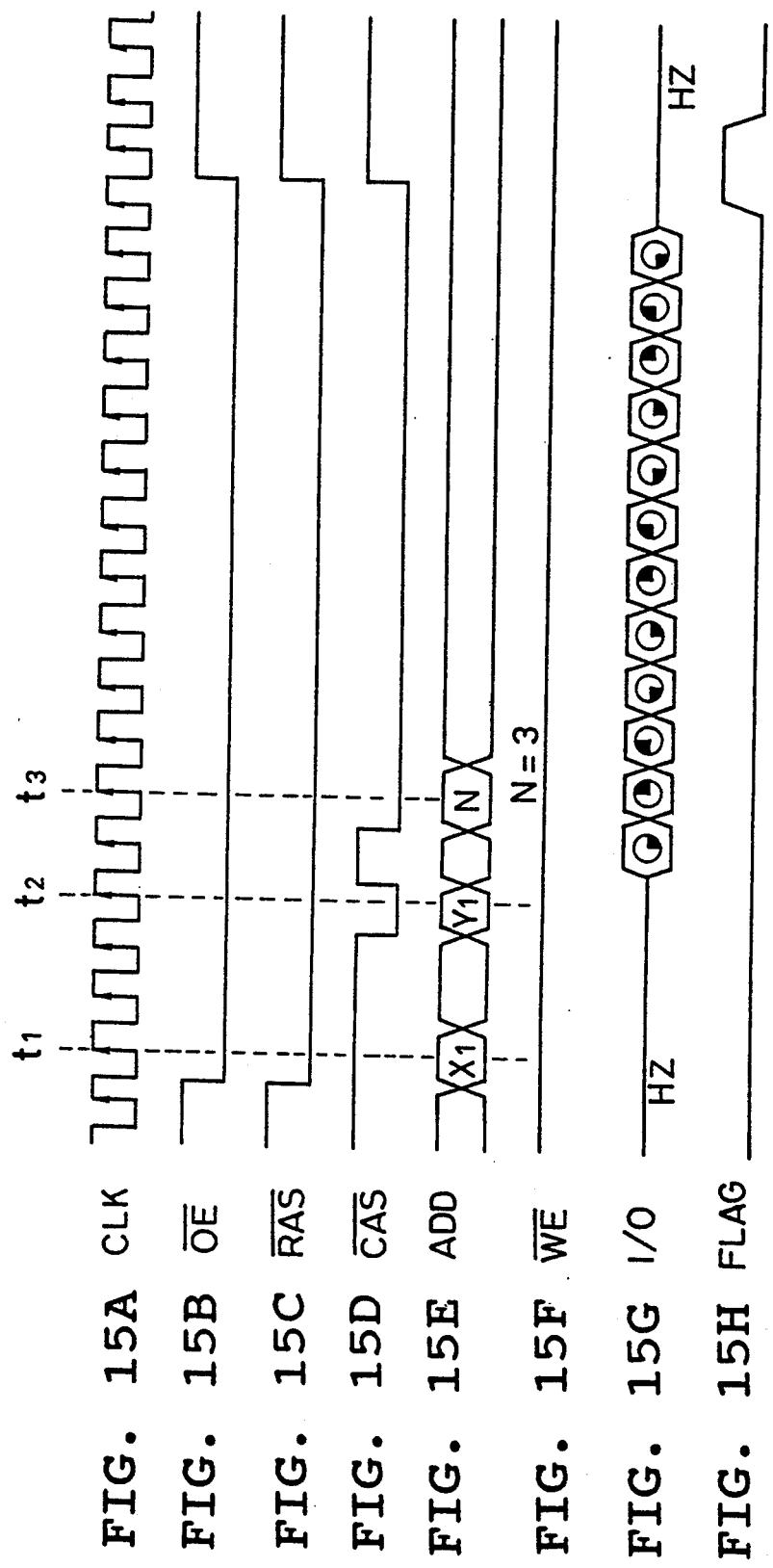
FIGS. 15A–15H are timing diagrams illustrating the operation of the seventh novel memory.

The operation of the seventh novel memory, illustrated in FIG. 15, is identical to the operation of the fourth novel memory illustrated in FIG. 9B with the addition of the flag output signal which goes high when a burst access is completed.

The advantage of the seventh novel memory is that a processor can delegate memory access to a memory management unit and execute other operations without having to count accessed bits. At the completion of memory access, the flag signal notifies the processor (or other external devices) that the memory is available to begin the next burst access.

Figure 16:
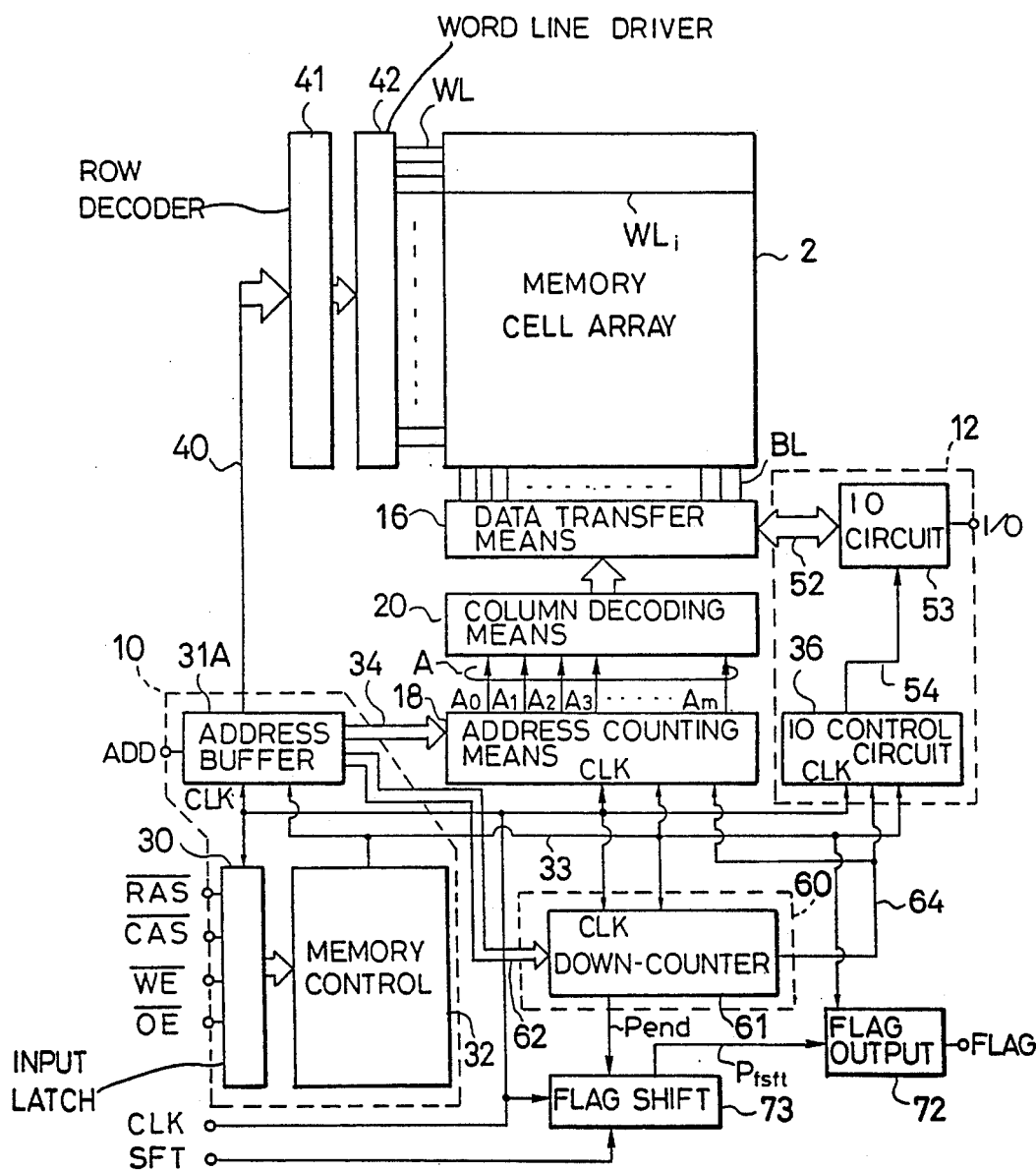
FIG. 16 is a block diagram of an eighth novel synchronous burst-access memory.

FIG. 16 is a block diagram of an eighth novel synchronous burst-access memory. Elements identical to elements in FIG. 14 are identified by the same reference numerals.

The access counting means 60 in FIG. 16 is adapted to generate a signal Pend that goes active a certain number of CLK cycles before the requested number of accesses have been completed. If the access counting means comprises a down-counter 61, for example, the Pend signal can be generated when a certain positive count is reached, this count being higher than the count value indicating completion of access.

The Pend signal is sent to a flag shifting circuit 73 and delayed by a certain time, the length of the delay being controlled, for example, by an externally input shift control signal denoted SFT. The delayed signal, denoted Pfsft in the drawings, is sent to the flag output circuit 72 and causes output of the flag signal.

Figure 17:
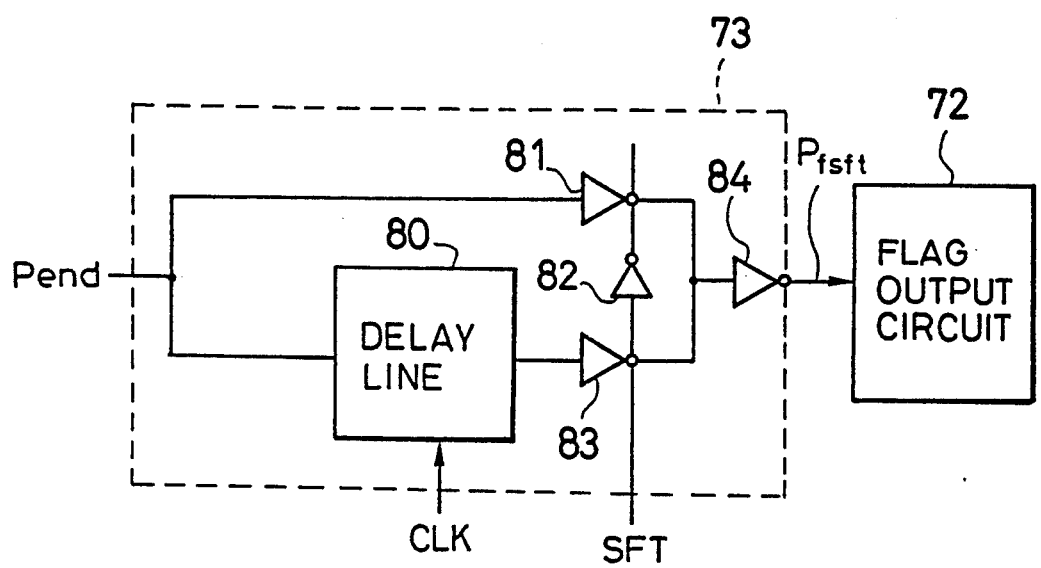
FIG. 17 is a schematic diagram of the flag shifting circuit in FIG. 16.

FIG. 17 is a schematic diagram of the flag shifting circuit 73 in FIG. 16, also showing the flag output circuit 72.

This flag shifting circuit 73 comprises an n-clock delay circuit 80 that receives the Pend and CLK signals and delays Pend by n CLK cycles, a tri-state buffer 81 that inputs Pend, an inverter 82 that inverts SFT, and a tri-state buffer 83 that receives the output of the n-clock delay circuit 80. The tri-state buffer 83 is enabled by the SFT signal; the tri-state buffer 81 is enabled by the inverted SFT signal created by the inverter 82. When enabled, both tri-state buffers 81 and 83 act as inverters. The output of whichever tri-state buffer 81 or 83 is enabled is inverted again by an inverter 84 to generate the output signal Pfsft which is sent to the flag output circuit 72.

FIG. 18 is a timing diagram for the flag shifting circuit in FIG. 17, showing the case in which n=1. When SFT is low, Pfsft lags Pend by only the slight propagation delay of the tri-state buffer 81 and the inverter 84. When SFT is high, however, Pfsft lags Pend by substantially one CLK cycle, going high on the falling edge of CLK in the next CLK cycle after Pend goes high.

FIGS. 19 and 20 illustrate the operation of the eighth novel memory when the access clock counter 63 is adapted to drive Pend high during the penultimate access, and the flag shifting circuit of FIG. 17 is used. In FIG. 19 SFT is high, so flag output is delayed and occurs when access is actually completed. In FIG. 20 SFT is low, so flag output occurs one CLK cycle earlier.

To take prompt advantage of the availability of the data bus, some processors may need to be notified one or more clock cycles before the bus becomes available. The eighth novel memory is useful in such cases. Control of the timing of the notification (FLAG signal output) by the SFT input signal enables the memory to be easily adapted to the timing requirements of different processors.

Instead of having an externally input signal (SFT) select the Pend-to-FLAG delay, it is possible to make this selection on a permanent basis when the memory device is fabricated. The selection can be made by a manufacturing option such as a metalization mask option, laser trimming option, or bonding option.

It will be apparent that the features of the second through eighth novel memories can be combined in ways other than those shown above. The clock-frequency-dividing feature of the second novel memory, for example, can be added to any of the other novel memories, and the temporary access halting feature of the sixth novel memory can be combined with the flag output feature of the seventh novel memory, or the shifted flag output feature of the eighth novel memory.

The preceding description has dealt mainly with matters related to the column address strobe signal $\overline{CAS}$, column address, and access count, but a synchronous, high-speed burst-access memory using DRAM memory cells also requires novel circuitry for row-address latching and word-line driving. A novel word-line driving circuit, applicable to synchronous DRAM in general, will be described next with reference to FIG. 21.

Figure 21:
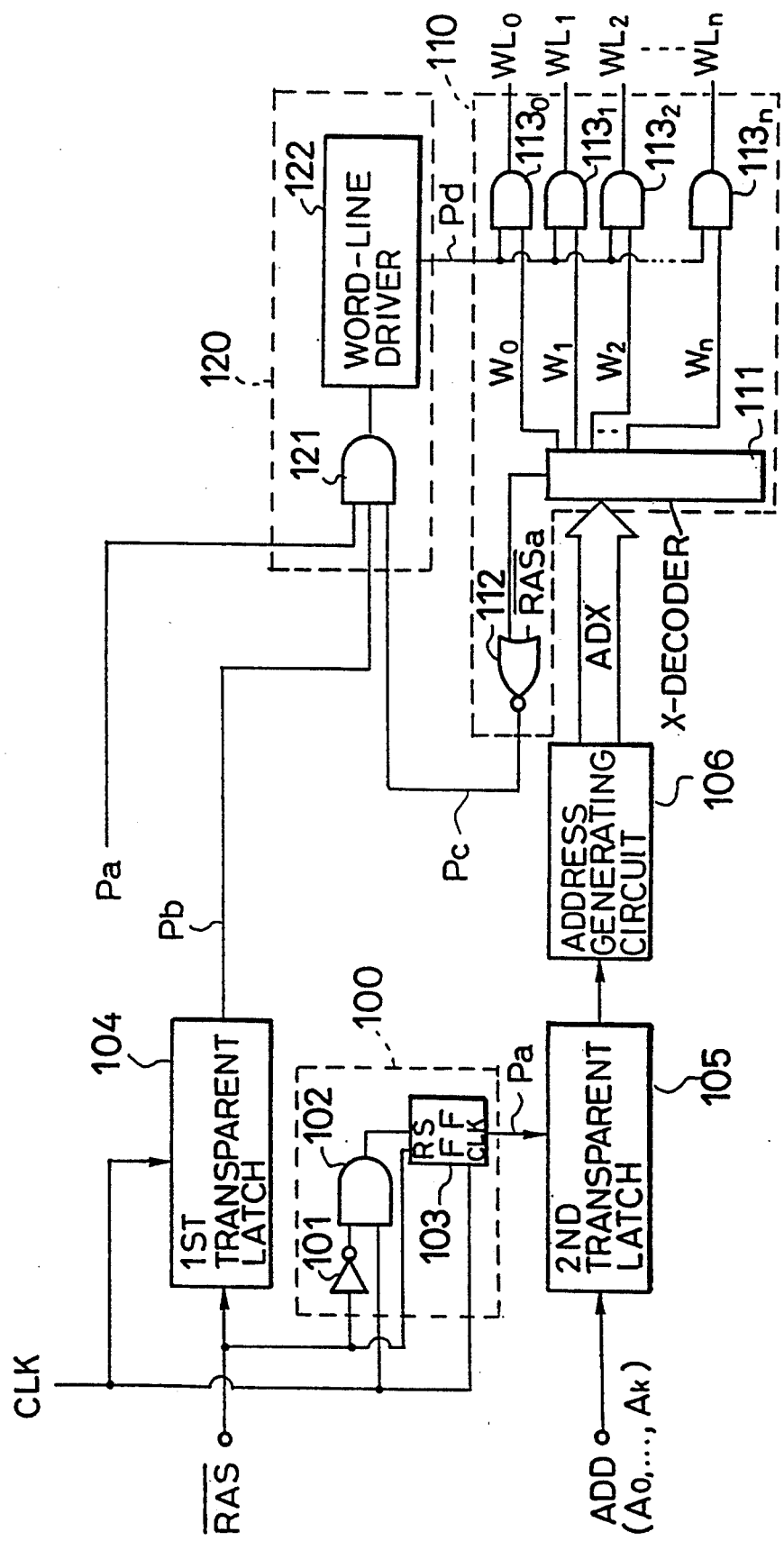
FIG. 21 is a block diagram of a novel word-line driving circuit for a synchronous dynamic memory.

The word-line driving circuit in FIG. 21 receives the clock signal CLK, the row address strobe signal $\overline{RAS}$, and address signals ($A_0, \ldots, A_k$) from the external address bus ADD. A clock generating circuit 100 combines CLK and $\overline{RAS}$ to generate an address latch clock signal Pa that becomes active when CLK and $\overline{RAS}$ are both active, and remains active until $\overline{RAS}$ becomes inactive. Pa and CLK are active high, and $\overline{RAS}$ is active low.

The clock generating circuit 100 in FIG. 21 comprises, for example, an inverter 101 that receives and inverts $\overline{RAS}$, an AND gate 102 that ANDs the inverted $\overline{RAS}$ signal from the inverter 101 with the clock signal CLK, and a flip-flop circuit 103 having set and reset input terminals. The set terminal (marked S in the drawing) receives the output of the AND gate 102. The reset terminal (marked R) receives $\overline{RAS}$. The output of the flip-flop circuit 103 goes high when the S input is high and the R input is low, remains unchanged while the S and R inputs are both low, and goes low when the S input is low and the R input is high. Transitions in the output of the flip-flop circuit 103 are synchronized with the rising edge of the clock signal CLK, which is supplied to a clock input terminal of the flip-flop 103.

The clock generating circuit 100 need not be structured as shown in FIG. 21. Other circuit configurations can be used instead.

The word-line driving circuit in FIG. 21 also has a first transparent latch circuit 104 and a second transparent latch circuit 105. A transparent latch is a circuit having a data input, a clock input and a data output. While the clock input is inactive (low in the present case), the data output changes according to the data input. When the clock input becomes active (goes high in the present case), the data output latches at its current value and remains unchanged as long as the clock input stays active.

The first transparent latch circuit 104 receives $\overline{RAS}$ as its data input and CLK as its clock input, and generates a first internal signal Pb as its data output. Pb and $\overline{RAS}$ have opposite polarity, Pb going high when $\overline{RAS}$ goes low and vice versa.

The second transparent latch circuit 105 receives the address signals $A_0, \ldots, A_k$ as its data input and Pa as its clock input. The second transparent latch circuit 105 accordingly comprises a plurality of one-bit latches that are clocked in parallel by Pa.

The output of the second transparent latch circuit 105 is supplied via an address generating circuit 106 to a wordline decoding circuit 110. The address generating circuit 106 transfers the output of the second transparent latch circuit 105 to the word-line decoding circuit 110 as a row address (ADX).

The word-line decoding circuit 110 decodes the row address ADX, selects one of a plurality of word lines $WL_0$ to $WL_n$, and generates a second internal signal Pc that becomes active when a word line has been selected. In FIG. 21 the word-line decoding circuit 110 comprises an X-decoder 111 that decodes the row address ADX and provides output signals to a NOR gate 112 and a plurality of AND gates $113_0, \ldots, 113_n$. The output signals $W_0, \ldots, W_n$ provided to the AND gates $113_0, \ldots, 113_n$ are the decoded address: as a result of decoding, the X-decoder 111 drives just one of the signals $W_0, \ldots, W_n$ high. The signal X provided to the NOR gate 112 is active low and signifies that the decoding operation has been completed; the signal X can be obtained from the signals $W_0, \ldots, W_n$ by NOR logic, for example.

The NOR gate 112 performs NOR logic on the signal X and a signal $\overline{RAS}a$ having the same polarity as $\overline{RAS}$. The output of the NOR gate 112 is the second internal signal Pc, which thus goes high when $\overline{RAS}$ is low and the decoded address is valid, indicating that a word line has been selected.

The word-line decoding circuit 110 need not be structured as shown in FIG. 21. Other circuit configurations are also possible.

The first internal signal Pb, the second internal signal Pc, and a control signal are supplied to a gating and driving circuit 120. In FIG. 21 the control signal is the address latch clock signal Pa. The gating and driving circuit 120 gates the first internal signal Pb according to the second internal signal Pc and the control signal Pa to generate a drive signal Pd, which drives the word-line selected by the word-line decoding circuit 110.

The gating and driving circuit 120 in FIG. 21 comprises a three-input AND gate 121 and a word-line driver 122. The AND gate 121 receives Pa, Pb, and Pc as inputs, carries out a logical AND operation on these inputs, and sends the resulting output to the word-line driver 122. The drive signal Pd generated by the the word-line driver 122 has the same polarity as the signal received from the AND gate 121. Pd is supplied to the AND gates $113_0, \ldots, 133_n$ in the wordline decoding circuit 110, and drives the word line $WL_i$ for which the corresponding signal $W_i$ from the X-decoder 111 is high.

The gating and driving circuit 120 need not be structured as shown in FIG. 21. For example, a control signal other than Pa can be used as the third input to the AND gate 121, or the output of the AND gate 121 can be used directly as the drive signal Pd, eliminating the word-line driver 122.

The operation of the word-line driving circuit in FIG. 21 will be described with reference to the timing diagram in FIG. 22.

At the beginning of FIG. 22 the address latch clock signal Pa, the first and second internal signals Pb and Pc, and the drive signal Pd are all inactive (low). No word line is driven: $WL_0, \ldots, WL_n$ are all low. The outputs $W_0, \ldots, W_n$ of the X-decoder 111 are in an invalid state.

To begin an access cycle $\overline{RAS}$ is driven low and a valid row address is placed on the address bus ADD. $\overline{RAS}$ and ADD must satisfy setup times Trs and Tas with respect to the rising edge of CLK. Trs and Tas must be long enough for row address decoding to be completed and the first and second internal signals Pb and Pc to become active before the rise of CLK at time $t_3$. In FIG. 21 $\overline{RAS}$ goes low and ADD becomes valid before the preceding falling edge of CLK, but this is not a necessary condition. For example, $\overline{RAS}$ and ADD input can be synchronized with the falling edge of CLK, as shown in earlier timing diagrams such as FIG. 2.

After $\overline{RAS}$ becomes active (goes low) at time $t_1$ in FIG. 22, when CLK goes low to unlatch the first transparent latch circuit 104, the first internal signal Pb likewise becomes active (goes high). In the meantime, since Pa is low the second transparent latch circuit 105 is unlatched and passes the row address from the address bus ADD via the address generating circuit 106 to the X-decoder 111.

At a time $t_2$ prior to $t_3$, the X-decoder finishes decoding the row address and drives just one of the signals $W_0, \ldots, W_n$ to the high state. In FIG. 22, $W_2$ is driven high. At this time the second internal signal Pc also goes high, signifying that row address decoding and word-line selection have been completed. The word-line decoding device is now ready to drive the selected word line as soon as CLK rises.

When CLK rises at time $t_3$ the address latch clock signal Pa goes high, closing the second transparent latch circuit 105. The row address on the address bus ADD can now be replaced with another address, such as a column address, without changing the selected word line. In addition, since all three inputs to the AND gate 121 are high, the drive signal Pd goes high, driving the selected word line $WL_2$ high.

The use of transparent latches for $\overline{RAS}$ and the address signals enables row address decoding to be advanced into the clock cycle preceding the time $t_3$ at which $\overline{RAS}$ and the row address are latched. Word-line driving therefore begins almost immediately after the rise of CLK, the only delay being the short propagation delay of the AND gates $113_2$ and 121 and of the word-line driver 122.

Although word-line driving is synchronized with the rising edge of CLK in FIG. 22, it can of course be synchronized with the falling edge by using transparent latches that close when CLK is low, and making other obvious modifications to the circuits in FIG. 21.

What is claimed is:

1. A word-line driving circuit to drive word lines in a synchronous dynamic memory that receives a clock signal, a row address strobe signal, and address signals, comprising:
   a clock generating circuit for generating an address latch clock signal that becomes active when the row address strobe signal and the clock signal are both active, and remains active until said row address strobe signal becomes inactive;
   a first transparent latch circuit, clocked by said clock signal, for latching said row address strobe signal and generating therefrom a first internal signal;
   a second transparent latch circuit, coupled to said clock generating circuit and clocked by said address latch clock signal, for latching the address signals;
   an address generating circuit, coupled to said second transparent latch circuit, for generating a row address from the output of said second transparent latch circuit;
   a word-line decoding circuit, coupled to said address generating circuit, for decoding said row address, thus selecting one word line, and generating a second internal signal that becomes active when said word line has been selected; and
   gating and driving means, coupled to said first transparent latch circuit and said word-line decoding circuit, for receiving a control signal, gating said first internal signal according to said second internal signal and said control signal to generate a drive signal, and driving the selected word line by said drive signal.

2. The circuit of claim 1, wherein said address latch clock signal is used as said control signal.

3. The circuit of claim 1, wherein said gating and driving means comprises:
   a three-input AND gate having said first internal signal, said second internal signal, and said control signal as inputs; and
   a word-line driver coupled to said three-input AND gate, for generating said drive signal from output of said three-input AND gate.

* * * * *

UNITED STATES PATENT AND TRADEMARK OFFICE
CERTIFICATE OF CORRECTION

PATENT NO. : 5,327,390
DATED : July 5, 1994
INVENTOR(S) : Atsushi Takasugi

It is certified that error appears in the above-indentified patent and that said Letters Patent is hereby corrected as shown below:

```
Column 4, line 24, "22." should read --22A-22o.--.
Column 5, line 22, "FIG. 2, which illustrates" should
read --FIGS. 2A-2H, which illustrate--.
Column 7, line 59, "FIG. 5 illustrates" should read
--FIGS. 5A-5I illustrate--.
          line 62, "FIG. 2." should read --FIG. 2A.--.
          line 64, "FIG. 5" should read --FIG. 5B--;
"FIG. 2." should read --FIG. 2A.--.
          line 65, "FIG. 5" should read --FIGS. 5A-5I--;
"FIG. 2" should read --FIGS. 2A-2H--.
Column 8, line 32, "FIG. 7 illustrates" should read
--FIGS. 7A-7I illustrate--.
Column 9, line 45, "FIG. 9B illustrates" should read
--FIGS. 9B-9H illustrate--.
Column 11, line 45, "11B," should read --11B-11G,--.
           line 52, "FIG. 11B," should read --FIGS.
11B-11G,--.
```

UNITED STATES PATENT AND TRADEMARK OFFICE
CERTIFICATE OF CORRECTION

PATENT NO. : 5,327,390
DATED : July 5, 1994
INVENTOR(S) : Atsushi Takasugi

Figure 18B:
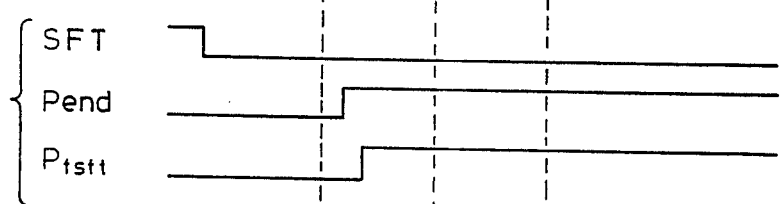
Figure 18C:
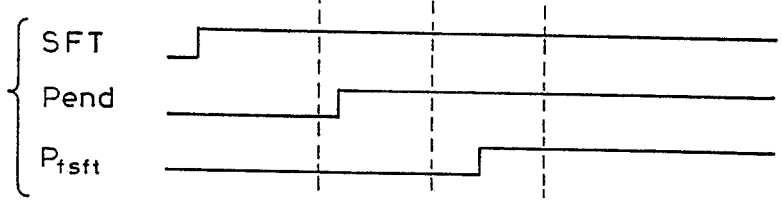

It is certified that error appears in the above-indentified patent and that said Letters Patent is hereby corrected as shown below:

Column 13, line 17, "FIG. 13B," should read --FIGS. 13B-13J,--.
Column 14, line 5, "FIG. 15," should read --FIGS. 15A-15H,--.
        line 6, "FIG. 9B" should read --FIGS. 9B-9H--.
        line 50, "FIG. 18 is" should read --FIGS. 18A-18C show--.
        line 57, "FIGS. 19 and 20" should read --FIGS. 19A-19J and 20A-20J--.
        line 61, "FIG. 19" should read --FIG. 19J--.
        line 62, "FIG. 20" should read --FIG. 20J--.
Column 16, line 68, "FIG. 22." should read --FIGS. 22A-22o.--.

UNITED STATES PATENT AND TRADEMARK OFFICE
CERTIFICATE OF CORRECTION

PATENT NO. : 5,327,390
DATED : July 5, 1994
INVENTOR(S) : Atsushi Takasugi

It is certified that error appears in the above-indentified patent and that said Letters Patent is hereby corrected as shown below:

Column 17, line 18, "FIG." should read --FIGS.--.
         line 19, "2." should read --2A-2H.--.
         line 21, "FIG. 22," should read --FIG. 22B,--.
         line 30, "FIG. 22," should read --FIG. 22F,--.
Column 18, line 4, "FIG. 22," should read --FIGS. 22A-22o,--.

Signed and Sealed this

Fifteenth Day of November, 1994

BRUCE LEHMAN

Attest:

*Attesting Officer*      *Commissioner of Patents and Trademarks*